(12) United States Patent
Crozier

(10) Patent No.: US 6,728,927 B2
(45) Date of Patent: Apr. 27, 2004

(54) METHOD AND SYSTEM FOR HIGH-SPREAD HIGH-DISTANCE INTERLEAVING FOR TURBO-CODES

(75) Inventor: Stewart N. Crozier, Groton, MA (US)

(73) Assignee: Her Majesty the Queen in Right of Canada, as represented by the Minister of Industry through the Communications Research Centre, Ontario (CA)

(*) Notice: Subject to any disclaimer, the term of this patent is extended or adjusted under 35 U.S.C. 154(b) by 482 days.

(21) Appl. No.: 09/864,396

(22) Filed: May 25, 2001

(65) Prior Publication Data

US 2002/0007475 A1 Jan. 17, 2002

Related U.S. Application Data

(60) Provisional application No. 60/207,195, filed on May 26, 2000.

(51) Int. Cl.$^7$ ............................................... H03M 13/03
(52) U.S. Cl. ...................................... 714/790; 714/787
(58) Field of Search .................................. 714/701, 790, 714/747; 711/157; 370/342; 375/130

(56) References Cited

FOREIGN PATENT DOCUMENTS

| CA | 2273407 | 11/1999 |
|---|---|---|
| CA | 2273418 | 12/1999 |
| CA | 2273592 | 12/1999 |
| CA | 2273608 | 12/1999 |

OTHER PUBLICATIONS

C. Berrou et al., "Near Shannon Limit Error–Correcting Coding and Decoding: Turbo–Codes", Proceedings of ICC '93, Geneva, Switzerland, pp. 1064–1070, May 1993.

C. Berrou et al., "Near Optimum Error Correcting Coding and Decoding: Turbo–Codes", IEEE Trans. on Comn., vol. 44 No. 10, Oct. 1996.

S. Crozier et al., "Performance and Complexity Comparison of Block Turbo–Codes, Hyper–Codes, and Tail–Biting, Convolutional Codes", 19–th Biennial Symposium on Communications, Kingston, Ontario, Canada, pp. 84–88, May, 1998.

K. Gracie et al., "Performance of a Low–Complexity Turbo Decoder and its Implementation on a Low–Cost, 16–Bit Fixed–Point DSP", the 10th International Conference on Wireless Communications, Calgary, Canada, pp. 229–238, Jul., 1998.

K. Gracie et al., "Performance of a Low–Complexity Turbo Decoder with a Simple Early Stopping Criterion Implemented on a SHARC Processor", International Mobile Satellite Conference (IMSC '99), Ottawa, Canada, Jun., 1999.

(List continued on next page.)

*Primary Examiner*—David Ton
(74) *Attorney, Agent, or Firm*—Morrison & Foerster LLP

(57) ABSTRACT

A system and method are provided for designing high-spread, high-distance interleavers for turbo-codes. The first approach is called high-spread random interleaving, and is based on a new and more effective definition of interleaver spread. The second approach is called dithered-diagonal interleaving. Both methods can be used to design interleaves of arbitrary length. The second approach can actually achieve the theoretical maximum spread for many specific block sizes, and at the same time include significant dither for the elimination of low-weight codewords. Both design methods are easy to implement and require very little processing. Also provided is a method for modifying any interleaver to improve the distance spectrum for a specific turbo-code. It is shown that, for a block size of only 512 data bits and for a code rate of $\frac{1}{3}$, the flares in the packet error rate (PER) and bit error rate (BER) curves can be kept below $10^{-8}$ and $10^{-10}$, respectively.

42 Claims, 12 Drawing Sheets

OTHER PUBLICATIONS

A. Hunt et al., "Performance Degradation as a Function of Overlap Depth when using Sub–Block Processing in the Decoding of Turbo Codes" International Mobile Satellite Conference (IMSC '99), Ottawa, Canada, Jun. 1999.

D. Divsalar et al., "Multiple Turbo Codes for Deep–Space Communications", JPL, TDA Progress Report 42–121, May, 1995.

D. Divsalar et al., :Multiple Turbo Codes MILCOM ' 95, pp. 279–285, Nov., 1995.

S. Benedetto et al., "Unveiling Turbo Codes: Some Results on Parallel Concatenated Coding Schemes", IEEE Trans. on Inform. Theory, vol. 42, No. 2 pp. 409–428, Mar., 1996.

S. Crozier et al., "Performance of Turbo Codes with Relative Prime and Golden Interleaving Strategies", IMSC ' 99, Ottawa, Canada, pp. 268–275, Jun. 1999.

J. Hokfelt et al, "Interleaver Design for Turbo Codes Based on the Performance of Iterative Decoding", IEEE International Conference on Communications (ICC '99), Vancouver, Canada, Jun. 1999.

S. Crozier et al., "Construction and Performance of New Tail–Biting Turbo Codes", 6–th International Workshop on Digital Signal Processing Techniques for Space Applications (DSP '98), ESTEC, Noordwijk, The Netherlands, paper 1–3, Sep., 1998.

METHOD AND SYSTEM FOR HIGH-SPREAD HIGH-DISTANCE INTERLEAVING FOR TURBO-CODES

FIELD OF THE INVENTION

The present invention relates generally to methods of data encoding and decoding for error correction, and more particularly to interleaving for turbo-codes.

BACKGROUND OF THE INVENTION

With the advent of modern information theory and the definition of Shannon's Limit it was determined that any given noisy communications channel has a finite, non-zero threshold above which a message cannot be transmitted with a guarantee of error free transmission. The establishment of Shannon's Limit was what is considered an existence proof, that is, it establishes that a coding method can be derived that reaches the defined limits for communicating over a noisy channel, but does not show how such a code may be derived.

In 1993, in a paper by C. Berrou, A. Glavieux, and P. Thitimajshima entitled "Near Shannon Limit Error Correcting Coding ad Decoding: Turbo Codes", Proceedings of ICC'93, Geneva, Switzerland, pp. 1064–1070, May 1993, a new communications scheme referred to as turbo coding was disclosed. This communications code offered transmissions near Shannon's Limit, as has in the ensuing years been modified numerous times to eke out any last performance advantage. Turbo codes (TC), like many other codes, used controlled redundant information, and interleaving to allow a decoder to correct for noise induced errors. The attention paid to turbo codes since 1993 is related to their powerful error correcting capability, reasonable complexity, and flexibility in terms of providing different block sizes and code rates.

One common turbo-code encoder consists of two 16-state, rate ½ recursive systematic convolutional (RSC) encoders operating in parallel with be data bits interleaved between the two encoders, as shown in FIG. 1. FIG. 1 illustrates a standard turbo code encoder 100, with a data stream $d_i$, which is provided to the modulator (not shown), RSC1 102, and the interleaver 104. The interleaver reorders the bits of data stream $d_i$ according to a predetermined set of indices, and provides its output to RSC2 106. The outputs of RSC1 102 and RSC2 106 $c_i^1$ and $c_i^2$ respectively are sets of parity bits that are provided to a standard puncturing unit 108, whose output is provided to a modulator (not shown). The feedback and feedforward polynomials used herein are (23, 35) octal, respectively. Other polynomials and number of states could also be used. Without puncturing, the overall code rate is ⅓. This is because the systematic data bits, $d_i$, are only included once. Higher code rates can be achieved by puncturing the code parity bits $c_i^1$ and $c_i^2$. (In some cases it can be beneficial to puncture a small number of systematic data bits, $d_i$, to improve flare performance, as will be shown.) Good interleaver spreading properties are desirable for both fast convergence and good distance properties. High (Hamming) distance is desirable for both lowering the so-called "error floor" or are and for making the flare as steep as possible. Hamming distance is the minimum number of symbols in a block that must be changed for a first codeword to become a second codeword. The further apart two blocks are, the more a block can be corrupted while retaining the ability for the decoder to properly decode the message. It is also important to reduce the number of codewords at or near the minimum distance.

RSC codes are often terminated with flush bits. Flush bits are employed because they increase the Hamming distance between codewords. The cost of the introduction of flush bits is a penalty in the code rate. A method of obtaining the benefits of the increased distances found in terminated RSC codes without the code rate penalty is to encode the RSC code in a circle. This technique is referred to as tail-biting. Tail-biting increases the distances of an RSC code without employing flush bits. If both RSC codes in a turbo encoder are either terminated or tail-biting the encoder is described as either dual terminating or dual tail-biting as the case may be. Though the design of dual terminating or dual tail-biting encoders must account for the presence of an interleaver, the design of the interleaves need not be varied.

Interleaving is a practice well known in the art. It is a method of arranging or permuting the elements within a block. In a turbo-code encoder the elements are typically data bits or data symbols. In a turbo-code decoder the data elements are typically soft data samples from the receiver.

Interleaving is a key component of turbo-codes, as shown in FIG. 1. Two interleavers that have been commonly investigated are the "random" interleaver and the so-called "S-random" or "spread" interleaver. The random interleaver simply performs a random or pseudo-random permutation of the elements without any restrictions.

Golden relative prime, golden, and dithered golden interleavers have previously been applied to the design of turbo-codes. Good error rate performance has been reported for small to medium sized blocks (on the order of 1000 data bits). These interleavers can be generated quickly and have excellent spreading properties. Even though the worst-case low-distance codewords are usually eliminated golden interleavers can still produce a large number of low-distance codewords, related to the regular structure of the interleaver.

Another recent interleaver design method tries to select the interleaver indexes by minimizing the correlation between the extrinsic inputs. Not surprisingly, the designed interleavers tend to have high-spread characteristics. It is also true in general that interleaves with high-spread characteristics tend to produce extrinsic values with low correlation. This is because the new definition of spread is inherently well matched to providing low extrinsic correlation.

FIG. 2 illustrates the components of a conventional interleaver 104 in the context of the encoder 100. The input of the interleaver is stored in a memory 110, which is at least as large as the interleaver block size (K symbols). An indexing engine 112, re-orders the symbols stored in the memory 110 according to the order provided by the indices 114. The re-ordered symbols are stored in memory 116 and provided as output. In some cases the interleaver can provide the re-ordered symbols directly without the need for memory 116.

The following is a general review of S-random interleavers. Interleavers can be defined and implemented in a number of different ways. FIG. 3 shows the definition used herein. The interleaver reads from a vector of input symbols or samples, $v_{in}$, and writes to a vector of interleaved or permuted output samples, $v_{out}$. The output samples are written sequentially using the time index i, i=0 . . . K–1, where K is the size of the interleaver. Vector I defines the order that the samples in the input vector are read. That is, the i-th output, written to location i in the output vector, is read from location I(i) in the input vector. With this model, the interleaved is completely defined by the integer read vector I. This illustration is used for definition purposes only, and does not necessarily represent a preferred method of implementation. As another example, vector I could define the write order.

The "S-random" interleaver is a semi-random interleaver. It is based on the random selection, without replacement, of K integers from 0 to K−1, but with the following constraint: each randomly selected integer is compared to the J−1 most recently selected integers. If the current selection is within J−1 of at least one of the previous J−1 integers, then it is rejected and a new integer is selected until the condition is satisfied.

This process is repeated until all K integers are extracted. The search time increases with J, and there is no guarantee that the process will finish successfully.

Note that J denotes the one-sided span of write indexes considered at each step, including the current index and ignoring edge effect. An appropriate (old) definition of spread, based on the S-random algorithm, for span J, and write indexes i and j, is as follows:

$$S''_{old}(J,i,j)=|I(i)-I(j)|, \text{for} |i-j|<j \quad (1)$$

The (minimum) spread associated with index i, for a given span J, is then defined as $$S'_{old}(J, i) = \min_{|j|=1}[S''_{old}(J, i, j)] \quad (2)$$

The (minimum) spread associated with the entire interleaver, for a given span J, is then defined as $$S_{old}(J) = \min_{i}[S'_{old}(J, i)] \quad (3)$$

For tail-biting turbo-codes all relevant operations should be performed modulo-K. With the above definitions, it is obvious, to one of skill in the art, that the spread of an interleaver designed using the S-random algorithm is at least the span J. That is, if the algorithm finishes successfully, then $S_{old}(J) \geq J$. In practice, one finds that the spread achieved is almost always equal to J for large values of J. The theoretical maximum spread for an S-random interleaver is (typically) floor ($\sqrt{K}$), for a span of the same. (There are exceptions depending on the specific values of K and J, and the boundary conditions, but this is a good general approximation, especially for large values of K.) As a rule of thumb, however, the choice J<$\sqrt{K/2}$ produces a solution in a reasonable amount of time. As an example, with a block size of K=512 data bits, the maximum theoretical spread is 22, but it is difficult to obtain a spread higher than 16, using the S-random algorithm.

It would be disingenuous to claim that the performance of conventional interleavers is poor. Although performance of conventional interleavers is good, improvements to interleavers can be easily applied to many existing communication systems to yield added performance.

It is therefore desirable to provide a practical interleaving system and method with relatively lower packet error rate (PER) and bit error rate (BER). It is further desirable to provide a method for modifying any interleaver to improve the distance spectrum for a specific turbo-code.

SUMMARY OF THE INVENTION

It is an object of the present invention to obviate or mitigate at least one disadvantage of prior art, specifically it is an object of the present invention to provide a method and system for interleaving elements to obtain a high spread.

In a first aspect, the present invention provides a method of determining interleaving indices for an interleaver, acting elements, comprising determining a minimum acceptable spread, spread being measured as the minimum of the sum of the distance between two elements prior to being interleaved, and the distance between the same two elements after being interleaved, over all pairs of elements, for each element, selecting an index from a predefined set of indices, the selected index maintaining the minimum acceptable spread and sorting the selected index elements to provide a quantized integer index vector. In an embodiment of the present invention the predetermined set of indices is a subset of the set of real numbers, such as (0,K), and the step of selecting an index includes randomly selecting an index from the predetermined set, and discarding any index if the minimum acceptable spreading goal is not maintained.

According to a further aspect of the present invention, there is provided a a method of determining interleaving indices for interleaving K elements comprising the step of defining a set of at least K points, which are optionally arranged as rows and columns that are separated from each other by $\sqrt{K}$ units, offsetting the points by varying the location of each point, defining the predefines set of indices as a subset of K point from the set of at least K points and determining a set of interleaving indices from the subset of K points. In a further embodiment, the rows and columns are parallel to the x and y axes, and the set of points is rotated, optionally by 45° prior to defining the predefined set. In other embodiments of the present invention the distances that the points are offset is taken from a randomly distributed set of distances, the points are offset in a direction parallel to one of the rows or columns of the set, all the points in a row or column are offset by a same amount independent of other rows or columns. In yet a further embodiment, K is twice the value of a perfect square, and an equal offsetting distance is applied to all points in a given rows $$\sqrt{\frac{K}{2}}$$

away from the given row, and $$\sqrt{\frac{K}{2}}$$

is relatively prime to the repetition period of a feedback polynomial associated with the interleaving process. In another embodiment the set of determining includes sorting the selected index element to provide a quantized integer index vector.

According to yet a another aspect of the present invention, there is provided an interleaver for a communications system comprising an input memory for receiving K elements from an input, an output memory for providing K elements to an output and an indexing engine for interleaving the K elements received from the input memory, in accordance with a quantized integer index vector, and providing the interleaved elements to the output memory, the interleaving indices being determined by determining a minimum acceptable spread, spread being measured as the minimum of the sum of the distance between two elements prior to being interleaved, and the distance between the same two elements after being interleaved, over all pairs of elements, for each element, selecting an index from a predefined set of indices, the selected index maintain the minimum acceptable spread and sorting the selected index elements to provide the quantized integer index vector. In an embodiment of the present aspect of the invention the indices are determined by randomly selecting an index from a set of possible indices, the selected index maintaining the minimum acceptable spreading goal in combination with the previously selected indices.

In a further aspect, there is provided an interleaver for a communications system comprising an input memory for receiving K elements from an input, an output memory for providing K elements to an output, an indexing engine for interleaving the K elements received from the input memory, in accordance with a quantized integer index vector, and providing the interleaved elements to the output memory, the interleaving indices being determined by defining a set of at least K points offsetting the points by varying the location of each point by a distance, defining a set of possible indices as a subset of points in the set of at least K offset points and determining the quantized integer index vector from K selected points from the set of possible indices.

In yet a further aspect of the present invention, there is provided a method of encoding a set of elements in a communication system comprising receiving a set of elements, encoding a first copy of the received set with a recursive systematic convolutional code, interleaving a second copy of the received set according to a set of interleaving indices providing a minimum spread, spread being measured as the minimum of the sum of be distance between two elements prior to being interleaved, and the distance between the same two elements after being interleaved, over all pairs of elements, encoding the interleaved copy with a recursive systematic convolutional code, puncturing the received set, the encoded first copy and the encoded interleaved copy, and transmitting the punctured set, the punctured encoded copy and the punctured encoded interleaved copy to a modulator.

Other aspects and features of the present invention will become apparent to those ordinarily skilled in the art upon review of the following description of specific embodiments of the invention in conjunction with the accompanying figures.

DESCRIPTION OF THE DRAWINGS

Preferred embodiments of the present invention will now be described, by way of example only, with reference to the attached Figures, wherein.

DETAILED DESCRIPTION OF THE INVENTION

Figure 1:
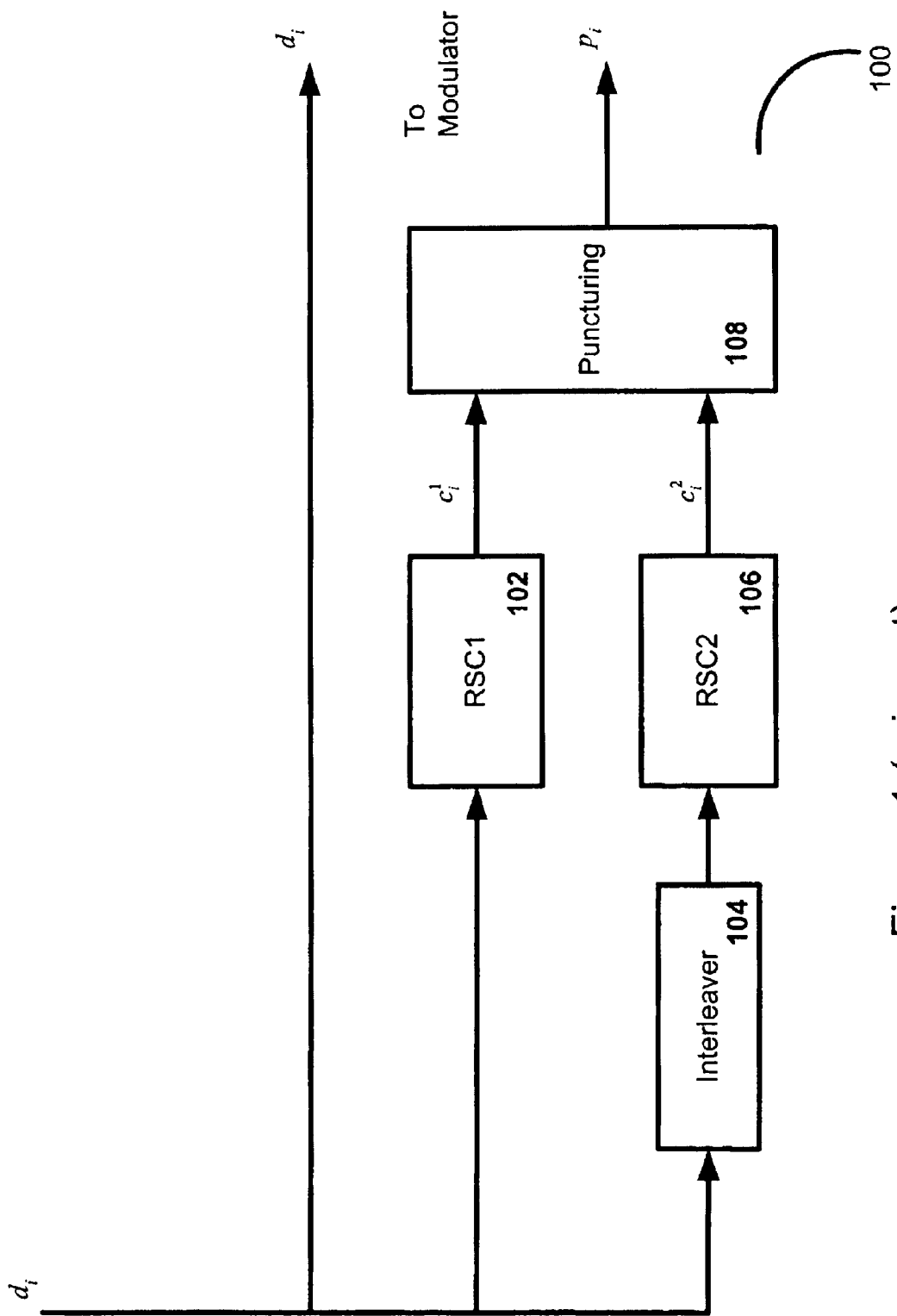
FIG. 1 illustrates a typical prior art turbo-code encoder using two rate ½ PSC encoders in parallel with puncturing.
Figure 2:
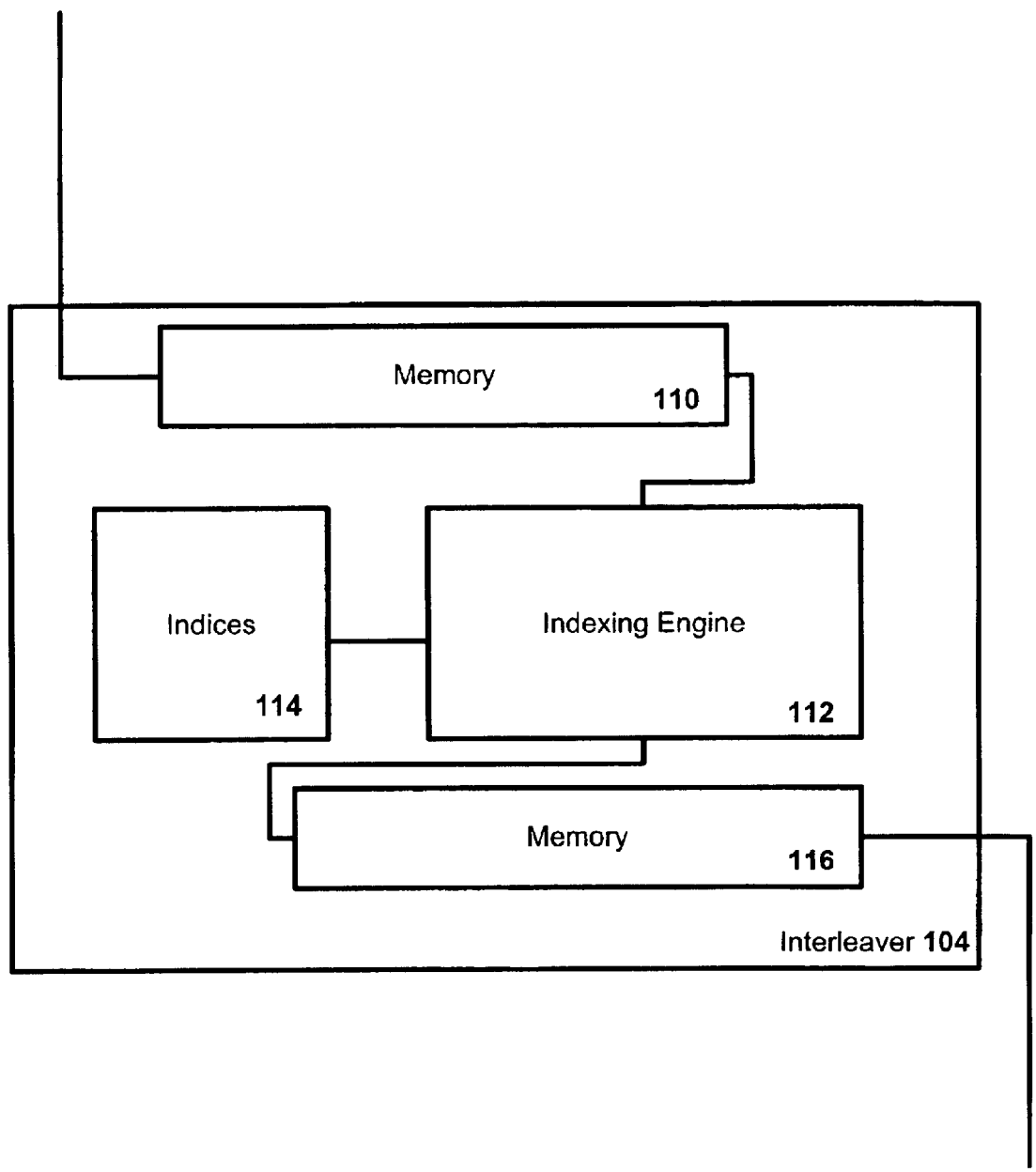
FIG. 2 illustrates a prior at implementation of an interleaver.
Figure 3:
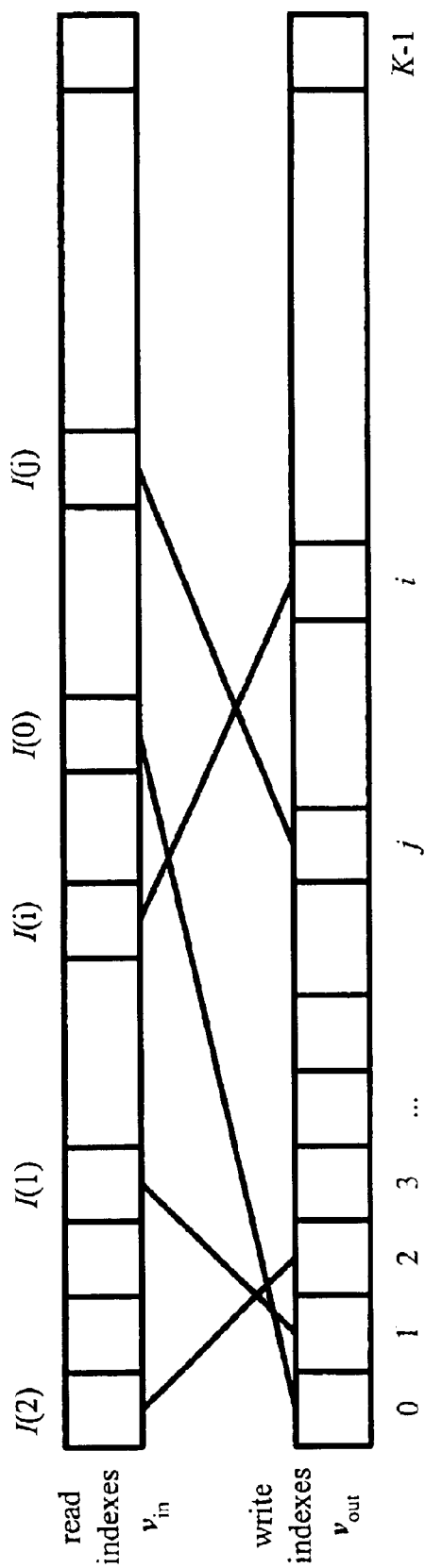
FIG. 3 illustrates a prior art interleaver definition and one possible method for implementation.

Section 1 describes a first method of designing high-spread random interleavers in accordance with this invention. Section 2 describes a second method for designing high-spread interleavers called dithered-diagonal interleavers. Section 3 describes a method for modifying any interleaver (post-processing) to improve the distance spectrum of the associated turbo-codes. Section 4 presents example bit and packet error rate results for a number of different interleavers and punctured code rates.

1. High-Spread Random Interleavers

A relatively more effective definition of interleaver spread is now introduced. The new spread definition does not require the specification of a span parameter, and is not linked to any particular interleaver design algorithm. The new spread measure associated with two write indexes i and j is simply defined as $$S''_{new}(i,j)=|I(i)-I(j)|+|i-j| \qquad (4)$$

The (minimum) spread associated with index i is then $$S'_{new}(i) = \min_{j,j\times 1}[S''_{new}(i,j)] \qquad (5)$$

And, the overall (minimum) spread is defined as $$S_{new} = \min_{i}[S'_{new}(i)] \qquad (6)$$

For tail-biting turbo-codes, all relevant operations should be performed modulo-K. From the new spread definitions, it can be shown that the new theoretical maximum spread is (typically) floor($\sqrt{2K}$). As an example, for a block size of K=512 data bits, the new theoretical maximum spread is 32. An interleaver designed using the S-random algorithm to have an old spread measure of 16 would typically yield a new spread measure of only 17, about half the new theoretical maximum.

A simple method for designing high-spread random interleavers is now described. The method is similar to the S-random approach, but with several important differences. First, the algorithm uses real read "indexes" instead of integer read indexes in the first stage of the design process. Second, a real spread constraint, and associated spreading goal, compatible with the new definition of spread is used. Finally, the integer read indexes are obtained by sorting the real read "indexes". The sorting technique is a means of forcing K real read indexes to K integer read indexes while maintaining the same order implied by the real read indexes.

Let R(i) and R(j) be two real read "indexes" in the real interval (0,K), where the interval notation means that 0 is included but K is not. The real spread associated with write indexes i and j is defined as $$S^{-}_{real}(i,j) = |R(i)-R(j)| + |i-j| \quad (7)$$

The (minimum) real spread associated with write index i is then $$S'_{real}(i) = \min_{l,j=1}[S''_{real}(i,j)] \quad (8)$$

And, for completeness, the overall (minimum) real spread is defined as $$S_{real} = \min_{i}[(S'_{real}(i)] \quad (9)$$

Again, for tail-biting turbo-codes, all reelvantoperations should be performed modulo-K. With these definitions, the constraint for the first stage of the design process is as follows. The current real read "index" R(i), for integer write index i, is selected at random from the real internal (0,K). If $S'_{real}(i)$, as defined in (8), is less than the integer spreading goal $S_{goal}$, then R(i) is rejected and a new real read "index" is selected until the condition is satisfied. Note that the write index j need only take on values from $i-S_{goal}+1$ to i−1 in (7). This process is repeated until K real read "indexes" are extracted. Similar to the S-random algorithm, the search time increases with $S_{goal}$, and there is no guarantee that the process will finish successfully. However, it has been found in practice that the process usually does finish successfully even when $S_{goal}$ is set close to the new theoretical maximum spread.

The next step is to sort the vector of real read "indexes" R and find the integer index vector Z that defines this sort. In other words, find index vector Z such that A(i)=R(Z(i)), i=0 . . . K−1, where vector A contains the elements of R in sorted (e.g. increasing) order. The final step is to assign the integer read indexes that define the interleaver according to J(Z(i))=i, i=0 . . . K−1.

Figure 4:
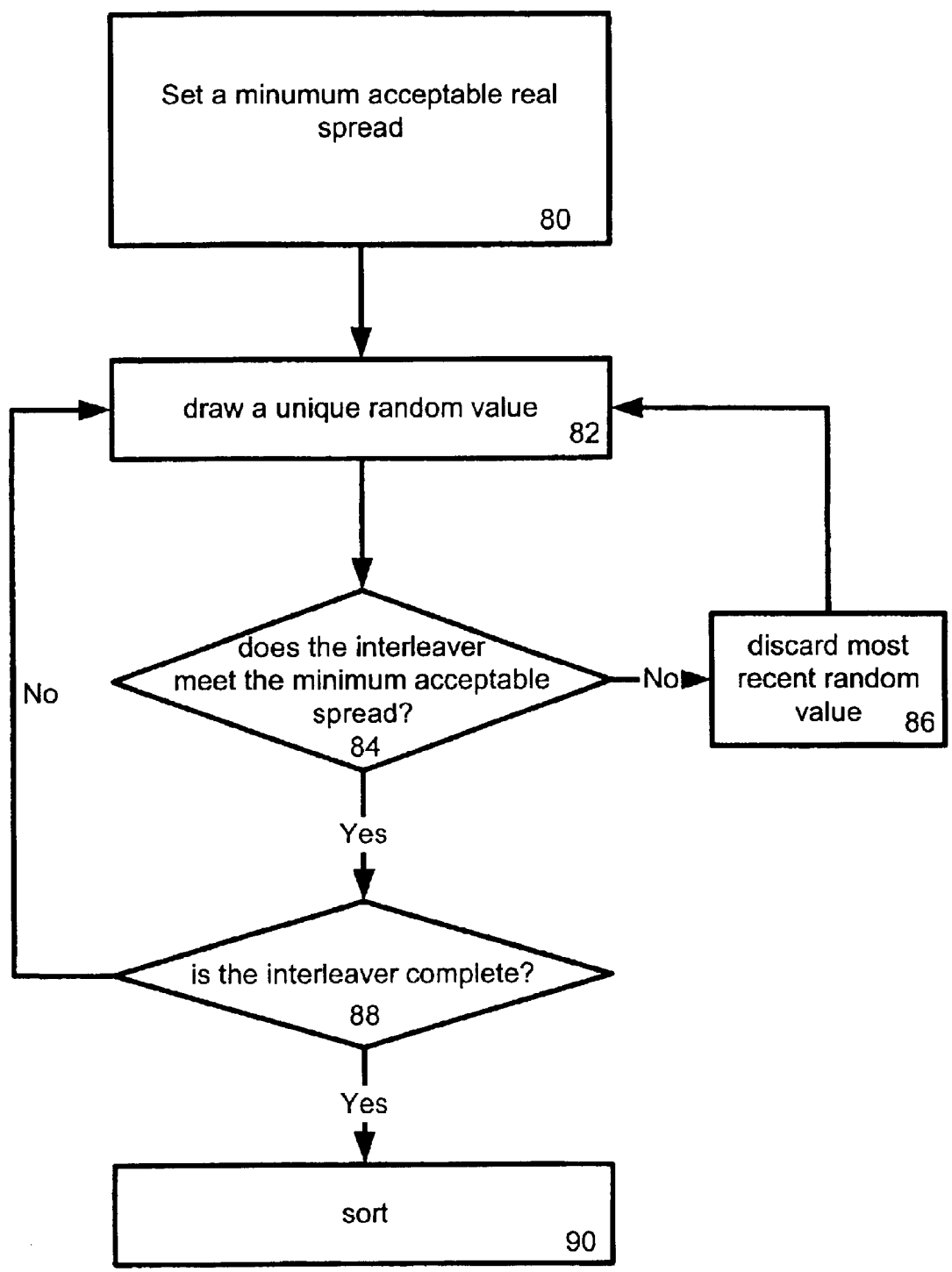
FIG. 4 illustrates an embodiment of a method of the present invention.

FIG. 4 illustrates the above described method. In step 80 a minimum acceptable real spread for the interleaver is defined, in accordance with the previously described definition for real spread. The next step is to draw, at random, a unique value 82 that becomes an interleaving index, this can easily be accomplished by removing indices from the random pool as they are drawn. After an index is drawn from the pool the interleaver is examined to ensure that it still exceeds or meets the minimum acceptable real spread 84. If the minimum acceptable real spread is not maintained the most recently drawn random value is discarded 86, and can optionally be returned to the pool of random values. After discarding the process returns to 82. If the minimum acceptable goal is met or exceeded by the interleaver, the number of indices is checked 88 to ensure that a sufficient number have been drawn for the interleaver. If the interleaver is not complete another random value is drawn in 82, and the process repeats until a sufficient number of random values have been drawn. After a sufficient number of indices have been drawn the real indices are sorted 90, where the real indices are sorted to create an integer index vector that defines the interleaver.

The spreading goal is not necessarily achieved throughout. However, the spreads associated with most of the indexes usually achieve the goal or come very close. As an example, for K512 data bits and a spreading goal of 28, it was found that the majority of the indexes had an associated spread of at least 28 and almost all the indexes had an associated spread of at least 26. The overall minimum spread of 24 occurred only twice. This is much higher than the spread of 17 achieved with the S-random algorithm.

2. Dithered-Diagonal Interleavers

Figure 5:
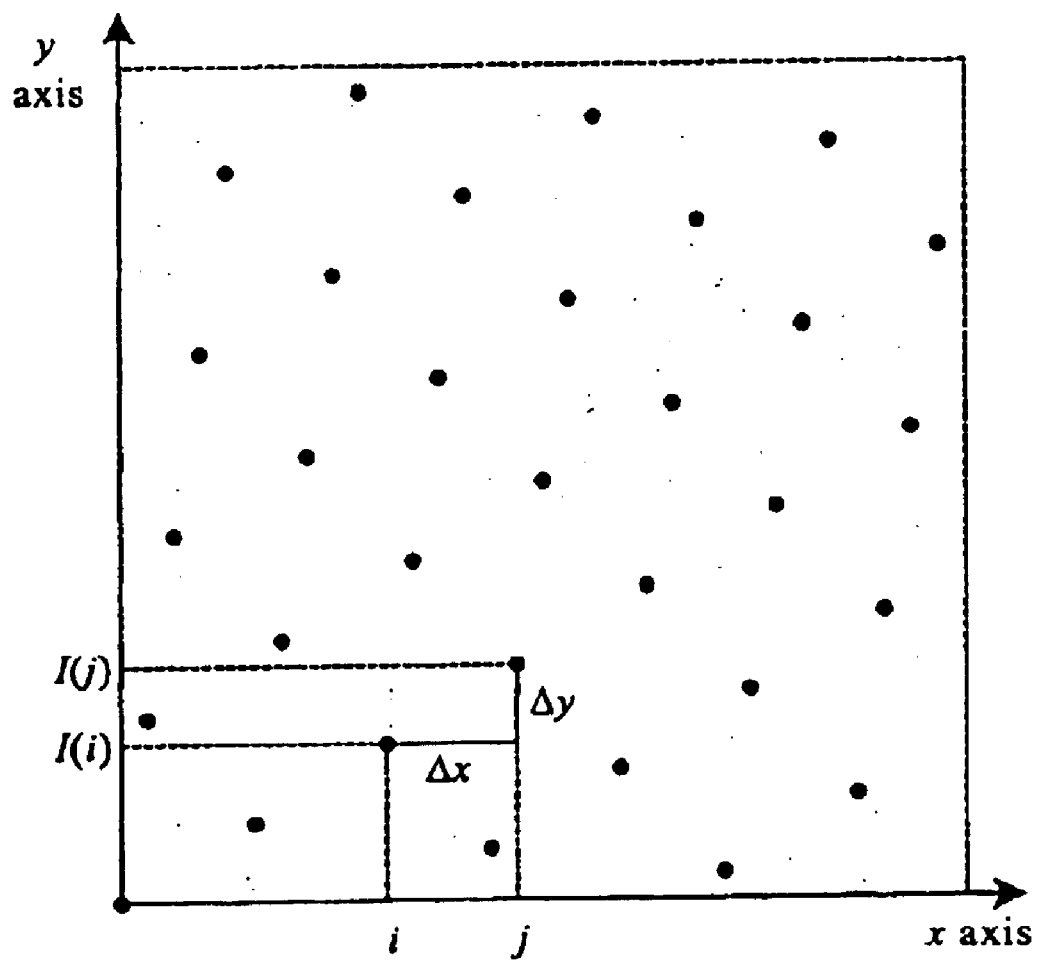
FIG. 5 shows an interleaver plot illustrating the spreading properties in accordance with an embodiment of the present invention having K=32.

This section describes a different approach to designing high-spread interleavers, based on the new definitions of spread. These new interleavers are called dithered-diagonal interleavers (for reasons that will become apparent) and can be designed for any block size, K. It is helpful to think of the read and write indexes as real numbers in the real range (0,K), although any range will do. In fact, real read and write "indexes" are used in the design process. An interleaver and its spreading properties can be visualized by plotting the read indexes (y-axis) against the write indexes (x-axis). FIG. 5 shows a example interleaver plot for K=32. The spread between two points, according to the new definition given in (4) or (7), is the magnitude of the difference between the read indexes (Δy) plus the magnitude of the difference between the write indexes (Δx). Two observations are key to the design. The first observation is that the maximum theoretical teal spread of $\sqrt{2K}$ can be achieved by a diagonal square-grid pattern of points with a diagonal spacing of $\sqrt{K}$ and a horizontal and vertical spacing of $\sqrt{2K}$. The second observation is that the points that lie on the same diagonal line (with slope 1 or −1, but not both) can be slid (dithered), as a unit, along this line without affecting the real spread between any two points in the plane. Further, all parallel diagonal lines can be dithered independently. A method of designing dithered-diagonal interleavers is now given.

Figure 6:
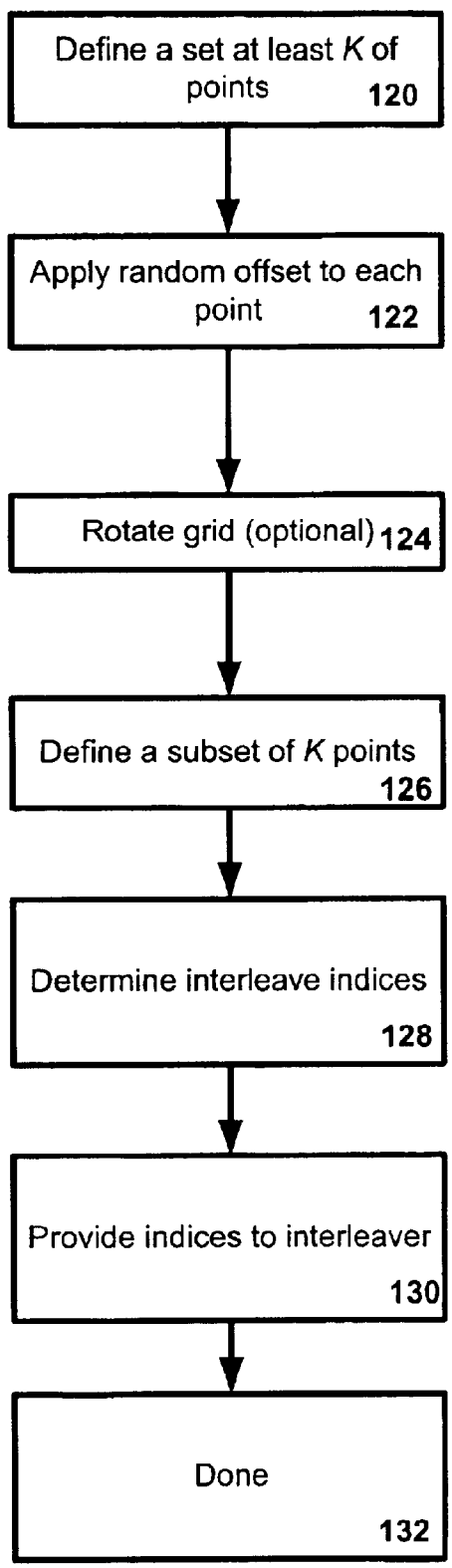
FIG. 6 illustrates an embodiment of a method of the present invention.

FIG. 6 illustrates a general method of determining a set of diagonally dithered interleaving indices, a more specific example follows. As a first step a set of at least K points is defined 120. In a presently preferred embodiment the set of points forms an evenly distributed grid arranged along axes that are parallel to the x-y axes. After defining a set of points, a random offset is applied to each point 122. The set of points is then optionally rotated 124. In a presently preferred embodiment the set of points is rotated by 45° to form a diagonal grid of points. A subset of K points is selected from the rotated set of points 126. This selected subset is then used to determine interleave indices 128 which are provided to the interleaver 130.

In a more specific example designed to illustrate an embodiment of the method for simplicity and performance the first step is to generate a regular diagonal square-grid of points with a real spacing of $\sqrt{K}$. The extent of this grid pattern need only be a little larger than the subset of points extracted in a following step. The second step is to dither the points along each line with slope 1 (or −1, but not both), as a unit, by adding a same random offset to the location of each point. For example, a uniform random offset in the range $(-\sqrt{K}/2, \sqrt{K}/2)$ works well. Each line should be dithered independently to maximize the degree of randomness. This grid need not be rotated as it is already a diagonal grid. The third step is to enclose exactly K of these points inside a square with sides of length K, parallel to the x and y axes. These K points are selected and represent the real read and write "indexes" of the interleaver.

The final step is to sort these real read and write "indexes", vectors R and W, respectively, and to determine the corresponding vector of integer read indexes, I, that uniquely defines the interleaver. This last step is similar to the sorting step described in the previous section, except that now it is necessary to also sort the real write "indexes", W. First, find index vector Z such that A(i)=R(Z(i)), i=0 . . .

K−1, where vector A contains the elements of R in sorted (e.g. increasing) order. Second, find index vector Y such that B(i)=W(Y(i)), i=0 . . . K−1, where vector B contains the elements of W in sorted (e.g. increasing) order. Next, let Z'(Z(i))=i and Y'(Y(i))=i, i=0 . . . K−1. Finally, assign the integer read indexes that define the interleaver according to I(Z(i))=Y'(i) i=0 . . . K−1. (The above procedure represents one possible implementation. Other equivalent steps and operations could be used to determine I from R and W.)

There are a number of variations and special cases. One very important special case will now be expanded upon. The algorithm presented thus far is general, in that it will work for any block size K. A special case of particular note is when $K=2n^2$, where n is an integer. In this case it is possible, and also desirable, to dither the diagonal lines in a modulo wrap-around sense, so that the final sorting step does not introduce any localized relative point-dither. This is accomplished in the procedure described above by simply repeating the line dither every n lies. That is, line m+n must have the same dither as line m. With this modification, the spread of the resulting interleaver achieves the theoretical maximum spread of $\sqrt{2K}=2n$ exactly. The modulo nature of the interleaver also ensures that the spreading properties hold for tail-biting turbo-codes. It has also been found that the interleaves can provide exceptional distance properties when n and the repetition period of the feedback polynomial are relative primes. Further, the interleaver can be completely defined, and implemented, using only n integer index-increment values, thus eliminating the need to store the entire interleaver.

Figure 7:
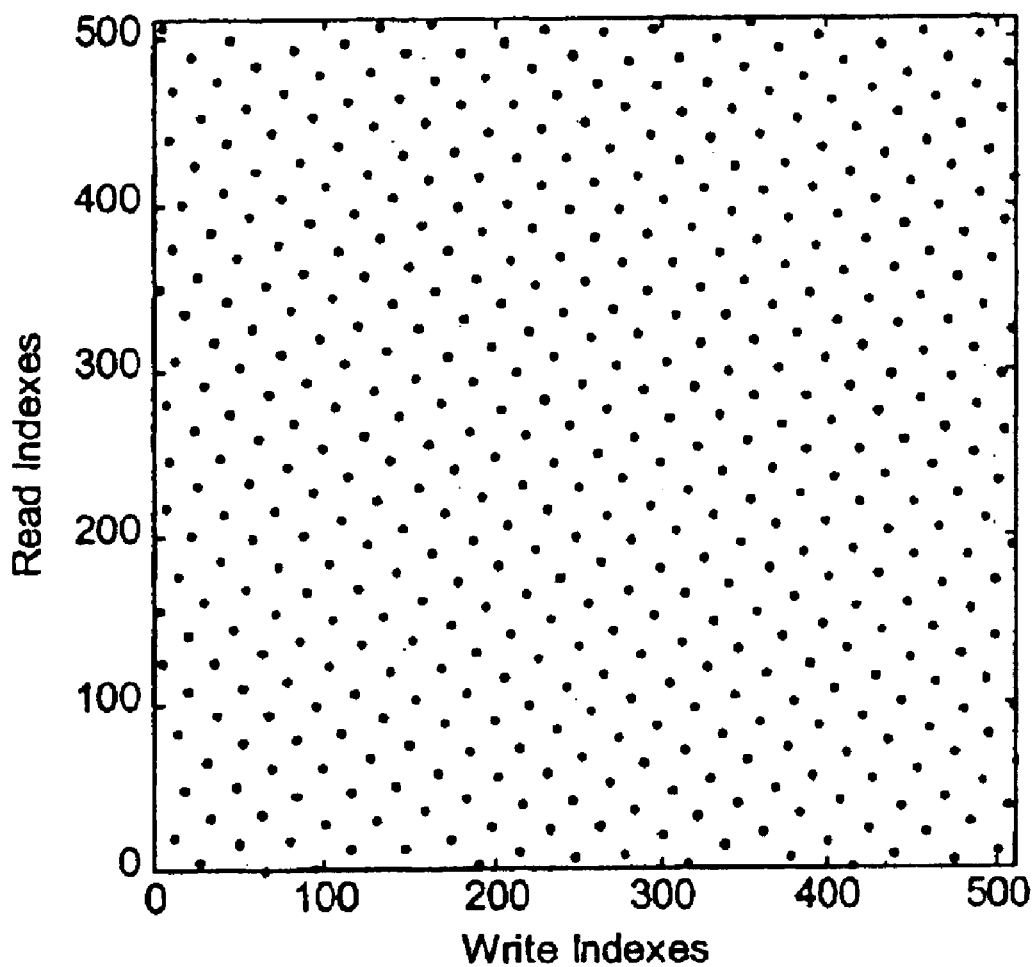
FIG. 7 illustrates a dithered-diagonal interleaver embodiment with K=512.

As an example, for n=16 and $K=2n^2=512$ data bits, the theoretical maximum spread of 2n=32 is achieved everywhere, and in a modulo sense. By judiciously selecting the diagonal dither, a minimum distance of 56 was achieved for all possible input patterns of weight 2, 3, and 4. The overall minimum distance may be lowers due to higher input-weight patterns. A plot of this interleaver is shown in FIG. 7.

One variation is to add an additional small amount of real dither in the other diagonal direction. This lowers the spread in a controlled manner, but also increases the amount of randomness, which tends to improve performance and convergence for large blocks with many thousands of bits.

It should be obvious to one of skill in the art that though the descriptions made herein refer to two dimensional implementations it would be trivial to extend this to a higher-order dimensional implementation. For example, a turbo-code consisting of three parallel RSC encoders with two interleavers would require a 3-dimensional interleaver design.

3. Post-Processing to Improve the Distance Spectrum

This section describes a method for modifying any interleaver (post-processing) to improve the distance spectrum of the associated turbo-code (TC). The method works best if the starting interleaves already has high-spread (according to the new definition) and has a significant random component. The new high-spread random and dithered-diagonal interleavers make excellent starting interleavers.

Up to this point, the interleaver design methods have not taken the specific distance properties of the RSC component codes, and corresponding TC, into account. In general, the higher the spread, the better the distance spectrum of the TC, but the distance spectrum can usually be improved further by adjusting the interleaver to eliminate the worse-case-low-weight TC codewords. For the most part, the worst-case TC codewords are constructed from low-input-weight patterns that lead to low-weight RSC codewords in both RSC codes. As an example, the 16-state RSC encoder, with feedback and feedforward polynomials (23,35) octal, respectively, is considered in some detail. The repetition period of the feedback polynomial is 15 in this case. The post-processing method is easily generalized to different RSC component codes with different repetition periods.

Post-processing involves three basic steps. The first step is to define or find the low-input weight patterns associated with the first RSC component code that generate low-weight RSC codewords. The second step is to interleave each pattern to see if it also results in a low-weight codeword for the second RSC code. If it does, then a low-weight TC codeword has occurred. The total weight of the TC codeword is the input-weight plus the weights from the two sets of parity. If this weight is less than the minimum distance goal then the third step is to swap indexes in the interleaver to try and eliminate this low-weight TC codeword. Each of these steps is now discussed in more detail.

Figure 8:
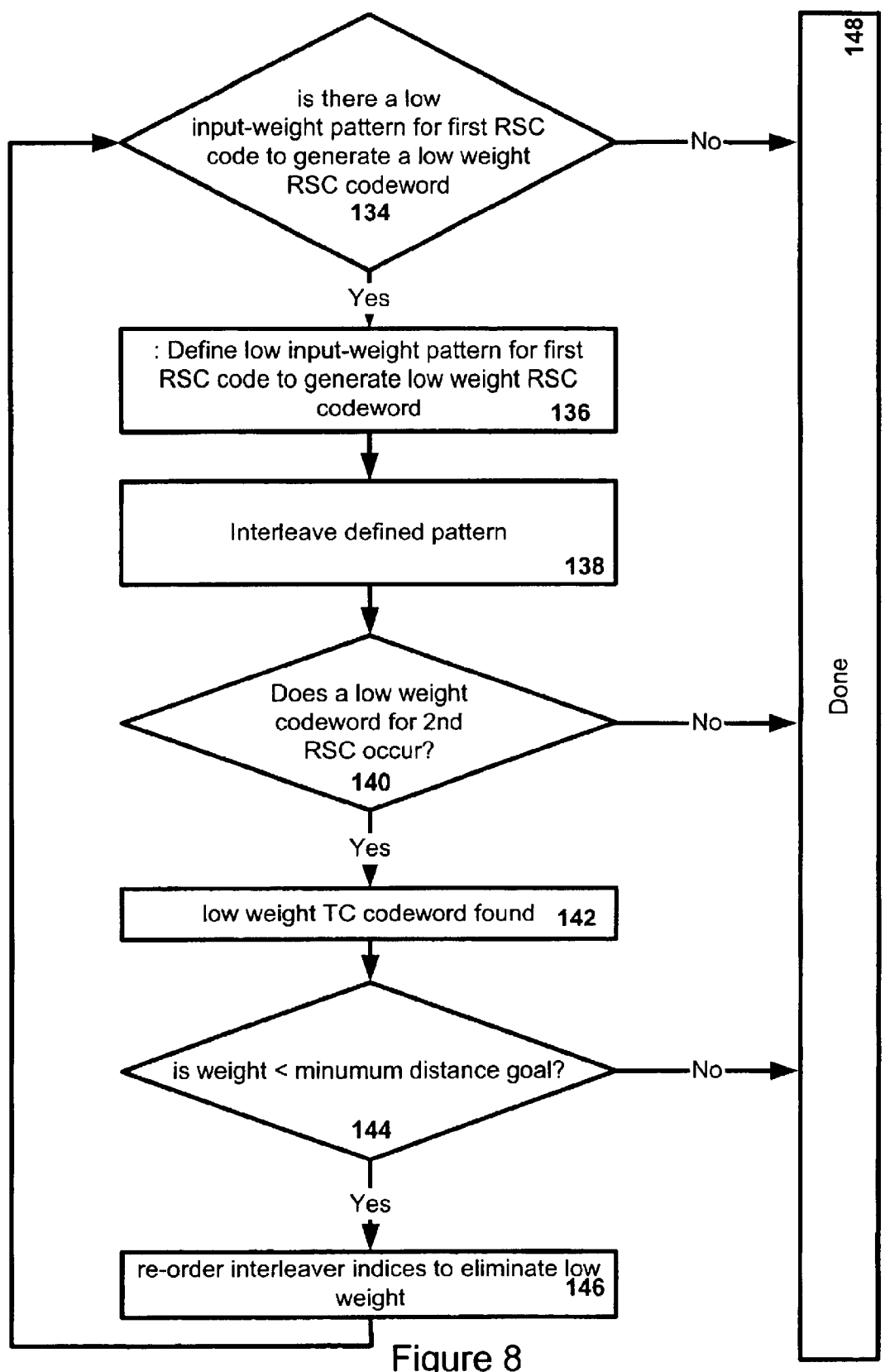
FIG. 8 illustrates an embodiment of a method of the present invention.

FIG. 8 illustrates a general method of post processing. Post processing starts by determining if there exists a low input-weight pattern for the first RSC code that will generate a low weight RSC codeword 134. If such a low input-weight pattern does exist it is defined 136, and then the defined pattern is interleaved 138. The interleaved pattern is examined to determine if a low weight codeword for the second RSC code has occurred 140. The total weight is the weight of the TC codeword. If a low weight TC codeword is found 142, its weight is compared to the minimum distance goal established for the TC 144. If the weight of the codeword is below the minimum distance goal the interleaver indices are re-ordered to try and eliminate the low weight TC codeword 146. The process is then repeated starting at 134. If in 134 it is determined that no such pattern exists then the process terminates 148. In step 140 if the interleaved pattern does not result in a low weight TC codeword the process terminates 148. In step 144, if the weight of the low weight TC codeword equals or exceeds the minimum distance goal then the process terminates 148. The process need not be fully complete for each possible input for an improvement to be realized. Thus in one embodiment the process is terminated after either a predetermined amount of computational time or after a predetermined number of iterations.

Proper termination of the RSC component codes is important to achieve good performance. It is assumed that either dual termination or dual tail-biting is used, although it is not necessary. With proper termination there can be no input weight-1 patterns. Proper termination also simplifies the procedure for the other cases. Low input-weight patterns with input-weights of 2, 3 and 4 are now considered in detail. The first low-weight patterns to contend with are the input-weight-2 patterns. For example, two 1's 15 apart going to two 1's 15 apart generates a total weight of 22 (2 from the input weight of 2 and 10 from each of the two sets of parity). Each additional multiple of 15 generates an additional weight of 8. For example, two 1's 30 apart going to two 1's 15 apart gives a total weight of 22+8=30. In general, two 1's 15a apart going to two 1's 15b apart, where a and b are both positive integers, gives a total weight of 6+8(a+b). Let the minimum distance goal for input-weight-2 patterns be $d_{goal}(2)$. Thus, to achieve a minimum distance of $d_{goal}(2)6+8m$, all combinations with a+b<m must be tested for and eliminated. Matlab routines have been developed that can easily test for distances in the hundreds. Note that a high-spread interleaver will automatically eliminate the worst-case patterns.

Input-weight-3 patterns are now considered. The basic procedure is the same, except that there are many more patterns to deal with. The worst-case input-weight-3 pattern generates only 4 parity bits per RSC code, for a total TC distance of 11. Let the minimum distance goal for input-weight-3 patterns be $d_{goal}$ (3). Then all input-weight-3 patterns with an RSC parity weight less than $d_{goal}$(3)-7 must be found. To achieve the minimum distance goal, all combinations with a total weight less than $d_{goal}$ (3) must be tested for and eliminated. It is currently practical to test for distances up to about 120. Again, a high-spread interleaver will automatically eliminate the worst-case patterns.

Input-weight-4 patterns are now considered. There are 4 sub-cases. The first sub-case is a general input-weight-4 pattern going to a general input-weight4 pattern. This sub-case is similar to the input-weight-3 case considered above, except that there are again many more patterns to deal with. The worst-case general input-weight4 pattern generates only 4 parity bits per RSC code, for a total TC distance of 12. Let the minimum distance goal for input-weight-4 patterns be $d_{goal}$ (4). Then all general input-weight-4 patterns with an RSC parity weight less than $d_{goal}$ (4)-8 must be found. To achieve the minimum distance goal all combinations with a total weight less $t_{goal}$ (4) must be tested for and eliminated. It is currently practical to test for distances up to about 100. Again, a high-spread interleaver will automatically eliminate the worst-case patterns.

Figure 9:
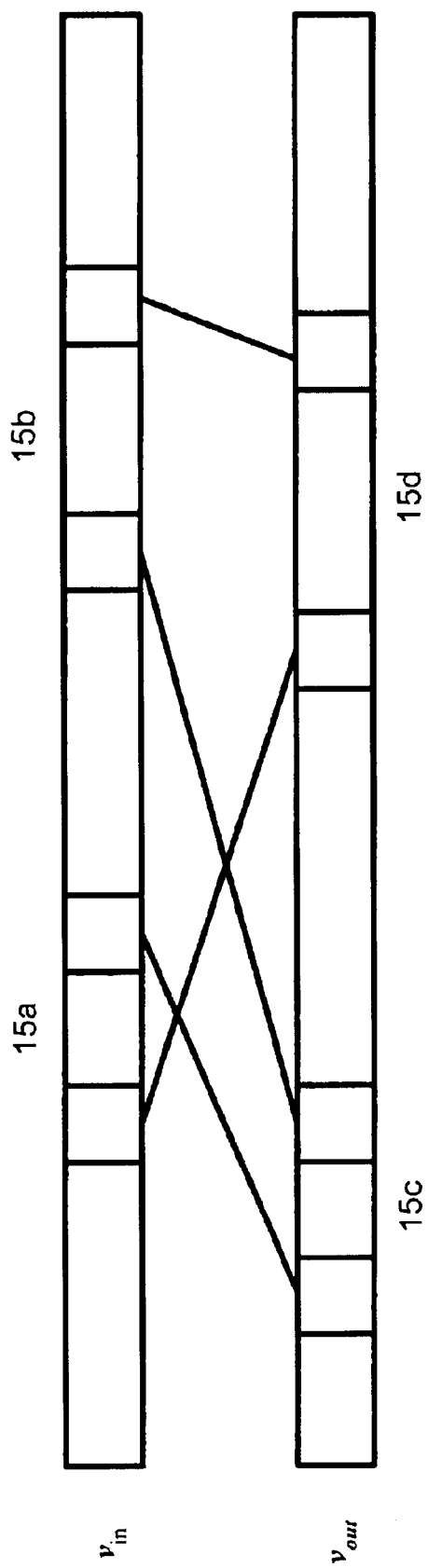
FIG. 9 illustrates two sets of two 1's a multiple of 15 apart going to two sets of two 1's a multiple of 15 apart, for the second input-weight-4 sub-case, with the minimum distance lower bound fixed at 44 in accordance with another embodiment of the present invention.

The second input-weight-4 sub-case is two sets of two 1's a multiple of 15 apart going to two sets of two 1's a multiple of 15 apart, as illustrated in FIG. 9. The lowest total weight occurs with single multiples of 15 everywhere and is 44 (4 from the input-weight of 4 and 20 from each of the two sets of parity). Each additional multiple of 15 generates an additional weight of 8. In general, two sets of two 1's with spacings of 15a and 15b going to sets of two 1's with spacings of 15c and 15d, where a, b, c and d are positive integers, gives a total weight of 12+8(a+b+c+d). Thus, to achieve a minimum distance goal of $d_{goal}$ (4)=12+8m, all combinations with a+b+c+d<m must be tested for and eliminated. Matlab routines have been developed that can easily test for distances up to 100. Note that high-spread interleavers do not necessarily eliminate the worst-case patterns for this sub-case. This is clear from the example mapping shown in FIG. 9.

The third input-weight-4 sub-case is a general input-weight-4 pattern going to two sets of 1's a multiple of 15 apart. The worst-case general input-weight-4 pattern generates only 4 parity bits. The lowest distance also occurs with single multiples of 15. Thus, the worst case TC distance is 28 (4 from the input-weight of 4, 4 from the first set of parity, and 20 from the second set of parity). Again, each additional multiple of 15 generates an additional weight of 8. Let the minimum distance goal for input-weight-4 patterns be $d_{goal}$ (4). Then all general input-weight-4 patterns with an RSC parity weight less then $D_{goal}$ (4)-24 must be found. All patterns composed of multiples of 15 with distances less $D_{goal}$ (4)-8 must also be taken into account. To achieve the minimum distance goal, all combinations with a total weight less than $d_{goal}$ (4) must be tested for and eliminated. It is currently practical to test for distances up to about 100. A high-spread interleaver does help in this case.

The fourth input-weight4 sub-case is the reverse of the third sub-case, that is, two sets of 1's a multiple of 15 apart going to a general input-weight4 pattern. This sub-case can be handled by simply applying the post-processing for the third sub-case to the inverse interleaver (deinterleaver). Note that all the other cases and sub-cases are symmetric and thus do not need to be applied to the deinterleaver. Conversely, they could be applied to the deinterleaver with equivalent results. This is taken advantage of below. Higher input-weight cases have also been considered.

The third post-processing step is to try and eliminate low-weight TC codewords by swapping specific indexes in the interleaver. The approach is based on a few key observations. First, the starting interleaver is defined in terms of both read and write indexes, even though one set may be trivial or inherent. Second, only one of the indexes associated with a low-input-weight pattern needs to change to eliminate a corresponding low-weight TC codeword. For example, each input-weight-4 pattern involves 4 read indexes and 4 write indexes. Only one of these 8 indexes needs to change to change this pattern. Third, swapping indexes may introduce other low-weight TC codewords. Thus, to minimize the probability of introducing other low-weight TC codewords, only one index should be changed per low-weight TC codeword found. Fourth, swapping indexes at random can significantly degrade the spread of an interleaver, but swapping only adjacent indexes causes very little degradation in the spread. This is true for both the read and the write indexes, and either set could be used for swapping. In fact, a combination is often best as proposed below. Note that swapping two adjacent indexes does not change the spread between these two indexes. Further, the spread between either of these two indexes and all other indexes can change by at most one. Even if all the (read or write) indexes were swapped with adjacent indexes, the spread between any two indexes can change by at most 2, and the spread is not necessarily decreased. It is important to keep the spread high because this minimizes the number of possible low-weight TC codewords that could be introduced when swapping.

The basic procedure used for index swapping is as follows. For each of the low-input-weight cases and sub-cases to be considered, test each write index, i, i=0 ... K-1, to see if it is associated with a low-weight TC codeword. If it is, then swap read indexes l(i) and l(i+1). If the current read index has already been swapped with the previous read index then skip the current write index. This ensures that each read index gets swapped at most once per post processing pass. Note that the write indexes do not have to be tested sequentially. Also, if the TC uses dual tail-biting then all relevant operations are performed modulo-K.

There is no guarantee that all low-weight TC codewords will be eliminated in a single post-processing pass. This is because index swapping can introduce other low-weight TC codewords. Multiple passes can be used to reduce the number of low-weight TC codewords further. The process is stopped after all low-weight TC codewords have been eliminated or a maximum number of passes has occurred. The highest minimum distance is usually achieved by lowering the minimum distance goal until the maximum number of passes is successful in eliminating all low-weight TC codewords. Setting the minimum distance goal higher than can be achieved initially, and then lowering it until the goal is achieved is also a useful technique for reducing the number of codewords with weights at or near the minimum distance.

Post-processing can be hindered by cycles. For example, if the i-th write index is associated with low-weight TC codewords bath before and after index swapping, and the i-th write index is the first index encountered for both codewords, then it is possible that the post-processing will simply cycle between these two codewords. Many cycles can be avoided by working with both the interleaver and the deinterleaver (effectively the read and write indexes). Applying the procedure described above to the interleaver causes adjacent read indexes in the interleaver to be swapped. Applying the above procedure to the deinterleaver effectively causes the write indexes in the interleaver to be swapped. Cycles can also be avoided by testing the write indexes in random order. The recommended approach is to randomly select either the interleaver or deinterleaver, for each pass, and to test the write indexes in random order. This ensures that all the read and write indexes associated with a low-weight TC codeword have an equal opportunity to be swapped. There are clearly many possible variations along this line that will also work well.

It has been found that the minimum distance of an interleaver can usually be made much higher than that of the starting interleaver, without significantly degrading the spreading properties of the starting interleaver. As an example, post-processing was applied to the high-spread random interleaver described earlier with K=512. After 3 post-processing passes the minimum distance was increased from 22 to 40 for all possible input patterns of weight 2, 3, and 4. The spread for most indexes remained at 26 or higher. The overall minimum spread dropped from 24 to 23, with only one occurrence at 23.

An interleaver designed, or post-processed, by the method of the present invention, as described above for exemplary purposes, contains an index vector of interleaving indices that are provided to the interleaving engine. The operation of an interleaver with such a design is known to those of skill in the art.

4. Example Performance Results

A number of practical sub-optimum iterative (turbo) decoding methods have been proposed in prior art. The simulation results presented here are based on the enhanced maximum-log-a-posteriori-probability (max-log-APP) approach, with scaled extrinsic information. It has been found that performance is typically within 0.1 to 0.2 dB of true log-APP iterative decoding, given the same number of decoding iterations. It is convention that one turbo decoding iteration be defined as two (max-) log-APP decoding operations (one for each constituent code). The amount of degradation is a function of block size, code rate, and signal-to-noise ratio (SNR), with the larger degradations occurring for large blocks, low code rates, and low SNRs. In practice, given a limited amount of processing, the enhanced max-log-APP approach usually provides the better performance because it can perform more iterations.

Performance results are presented for an interleaver size of K=512 data bits. The turbo-code uses two identical, parallel, 16-state, rate ½ RSC codes, with polynomials (23,35) octal. The repetition period of the feedback polynomial is 15. A dual tail-biting method was also used. Thus, no flush bits were required, and the unpunctured code rate is exactly ⅓. The maximum number of decoding iterations was set to 16.

Figure 10:
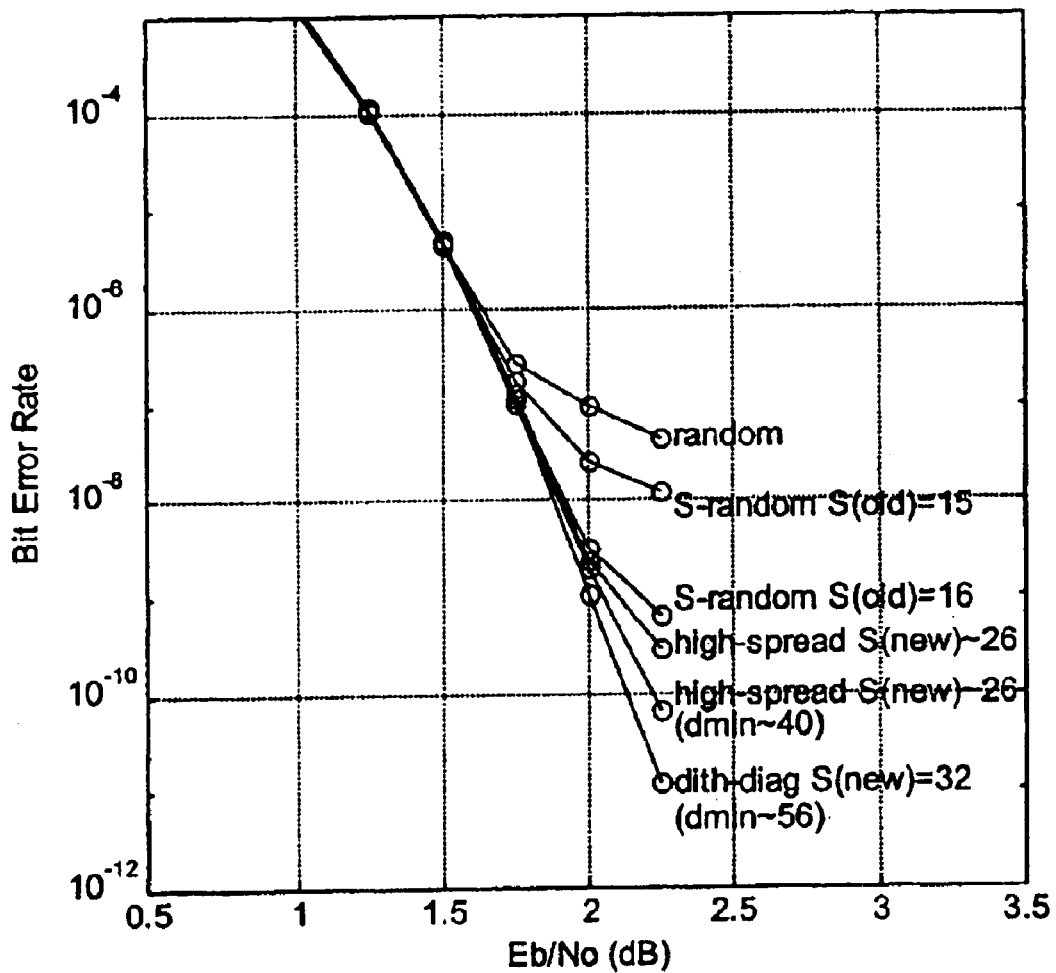
FIG. 10 shows a comparison of PER results for a number of different interleaver embodiments with K=512 data bits and a code rate of ⅓.
Figure 11:
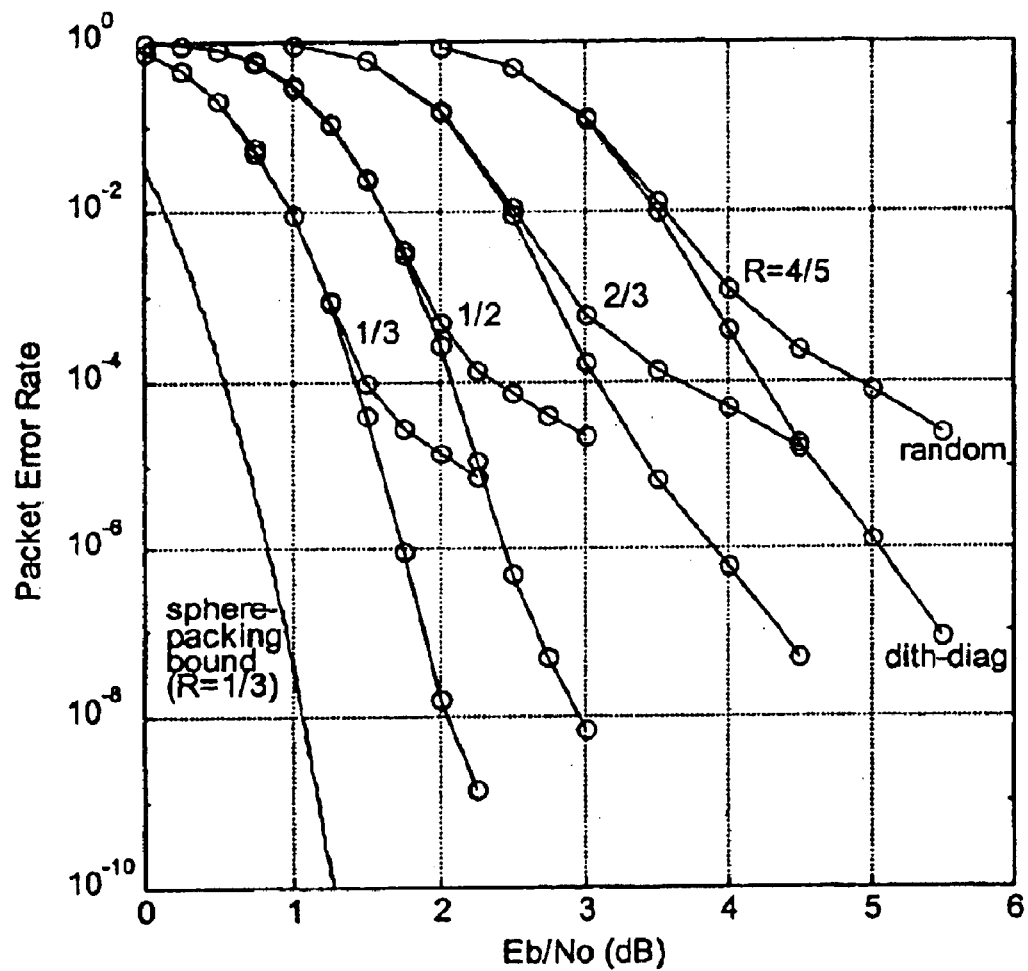
FIG. 11 shows a comparison of BER results for a number of different interleaver embodiments with K=512 data bits and a code rate of ⅓.

FIGS. 10 and 11 show the packet error rate (PER) and bit error rate (BER) performance results obtained for a number of different interleavers. The "random" interleaver is the worst, as expected. The "S-random" interleavers were designed using the conventional methods. Performance is much better with $S_{old}(16)=16$ than with $S_{old}(15)=15$ because the worst case input-weight-2 patterns (two I's 15 apart going to two 1's 15 apart) are eliminated with $S_{old}(16)=16$. The minimum distances for the first and second S-random interleavers were measured to be 22 and 27, respectively. Results are shown for two "high-spread" random interleavers. In both cases the effective spread (new definition) was about 26. The worst-case input-weight-2 patterns were also eliminated in the first case, and the minimum distance was 29. Post-processing was applied in the second case to increase the minimum distance to 40 for all input-weight-2, 3, and 4 patterns. The dithered-diagonal interleaver provided the best performance. This interleaver achieves the new theoretical maximum spread of 32, and the minimum distance for all input-weight-2, 3, and 4 patterns was measured to be 56. Post-processing was not used to increase the distance of this interleaver. Instead, many different diagonal dithers were tested to achieve this distance. Thus, this interleaver can be stored and implemented using just 16 different index-increments. Only 6 packet errors were counted for the lowest point on this curve. FIG. 10 also shows Shannon's continuous-input sphere-packing bound for a rate ⅓ code. Note that the dithered-diagonal interleaver provides performance within 1 dB of this bound even for a PER as low as $10^{-8}$.

Flare performance can be improved for the high code rates by puncturing a small number of systematic data bits, in exchange for the same number of parity bits. This works because the lowest distance TC codewords are mostly associated with low-input-weight patterns. With a good interleaves, and thus a good distance spectrum, most of be distance comes from the parity bits. There is a trade-off however, as puncturing the systematic data bits tends to slow convergence and thus degrade performance at low SNRs. Generally, the more data bits that are punctured the better the flare performance but the poorer the performance up top. In addition to the above trade-off, there is an obvious practical limit to the number of data bits that can be punctured. The punctured code rate for the first RSC code should always be less than 1. to start the iterative decoding process. This code rate limit does not strictly apply to the second RSC code. In fact, good performance has been observed with the punctured code rate or the second RSC code as high as 1. As a rule of thumb, however, the punctured code rates of the two RSC codes should be about the same, otherwise the sparset parity puncture mask will tend to dominate the distance spectrum. An encoder, used to encode a set of data bits, under the above described method, would have the common elements of an RSC encoder, but the puncturing unit would be applied to the data stream as well as the parity bits. The puncturing would be governed by a set of puncturing masks that would puncture the parity bits more frequently than the data bits to improve flare.

Figure 12:
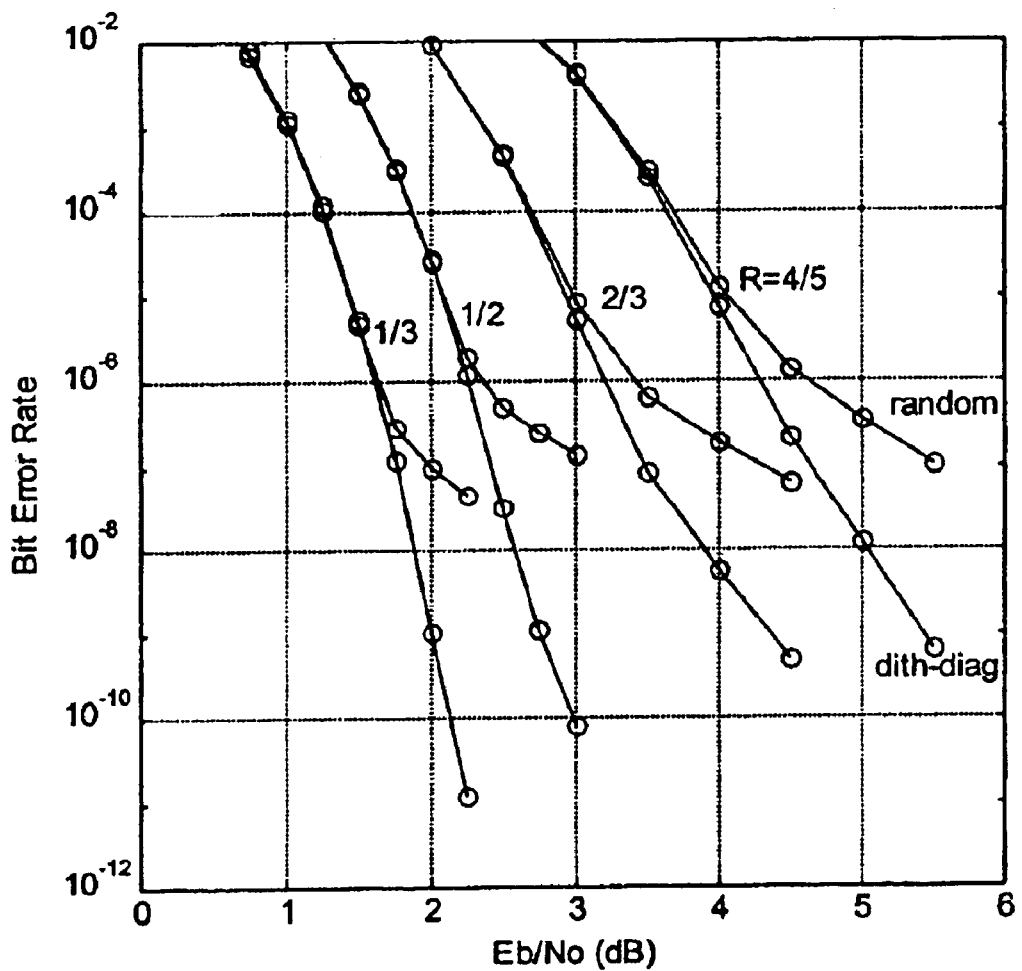
FIG. 12 shows PER results for random and dithered-diagonal interleaver embodiments with K=512 and two cases of rate ⅔ puncturing, wherein the puncture masks for cases 1 and 2 are (1,0100,0010) and (01111111111111, 1001000, 0100100), respectively.
Figure 6:
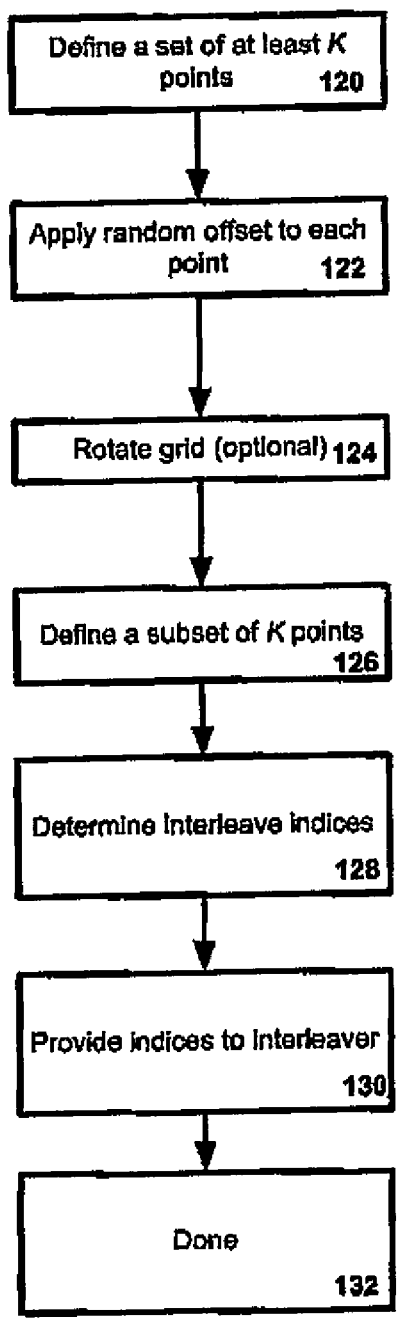
Figure 9:
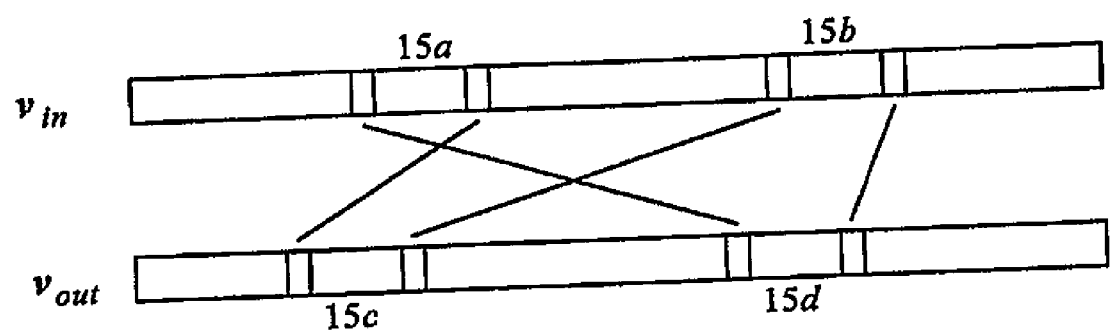
Figure 10:
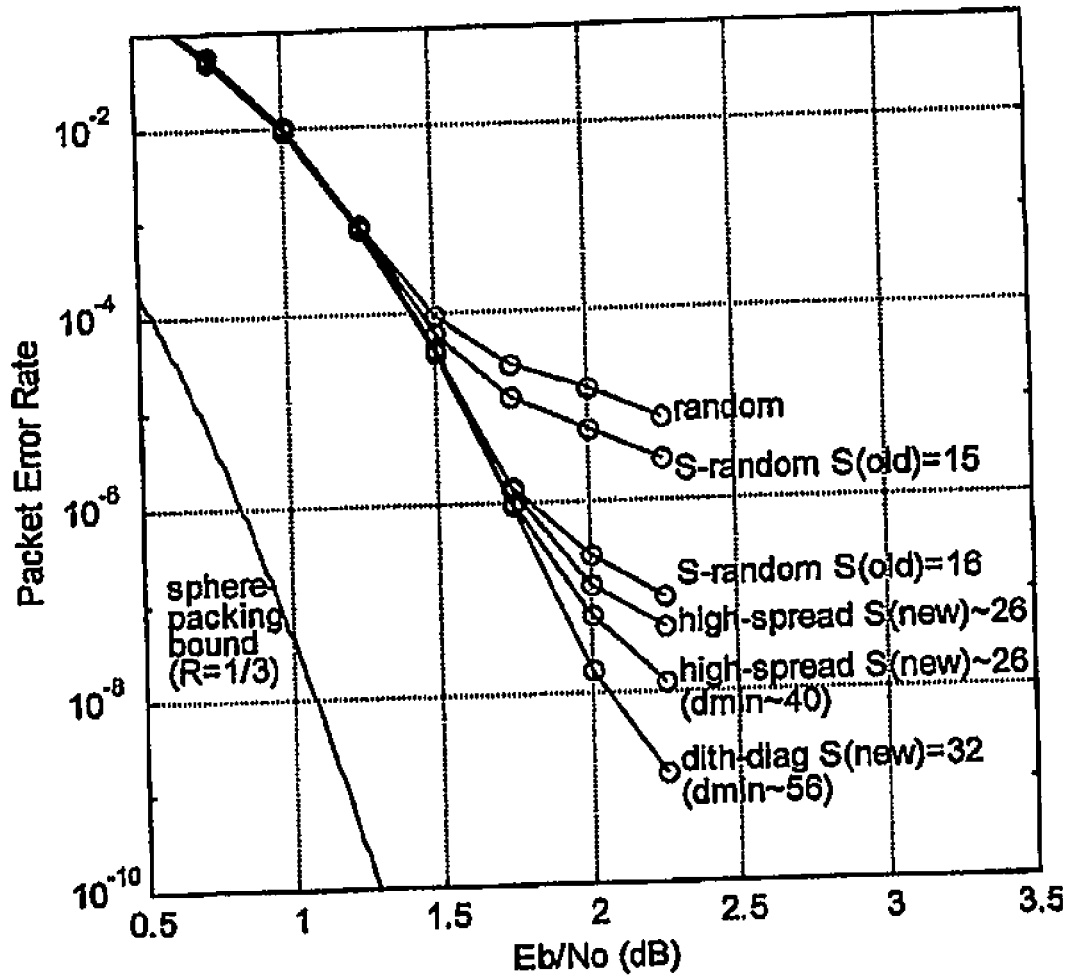
Figure 11:
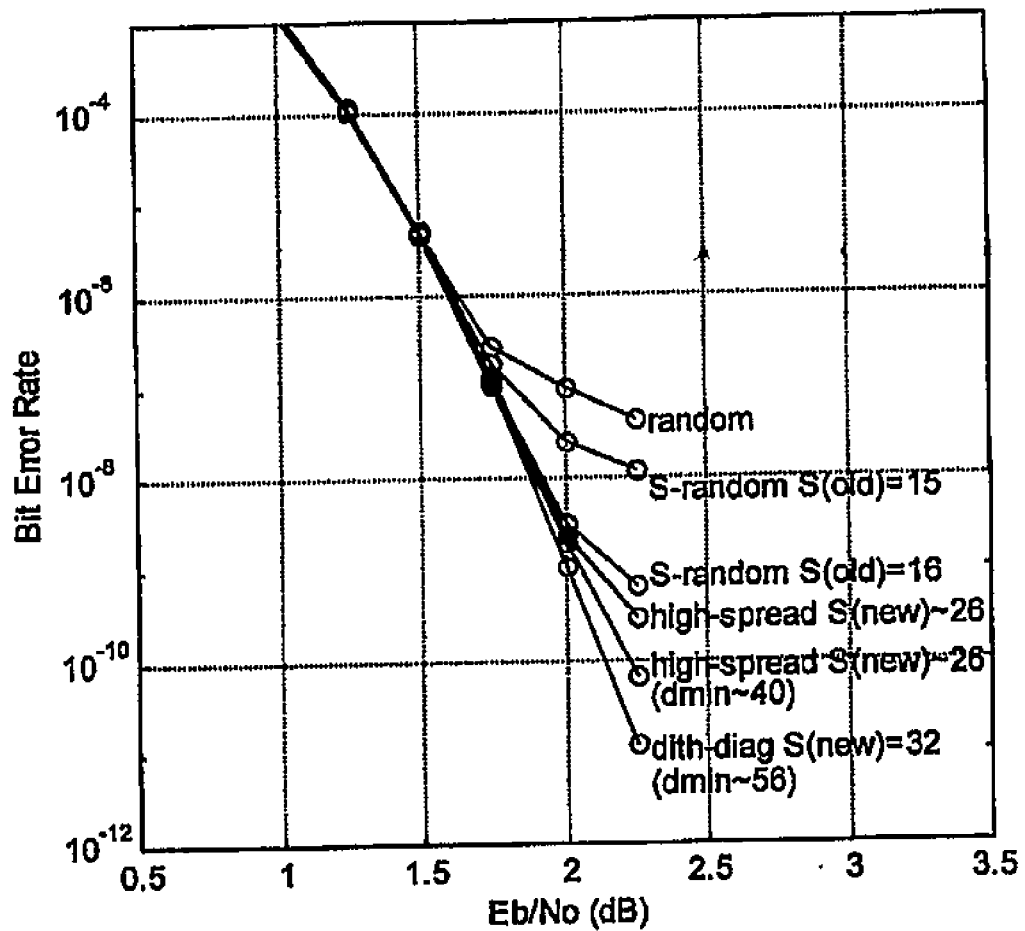
Figure 12:
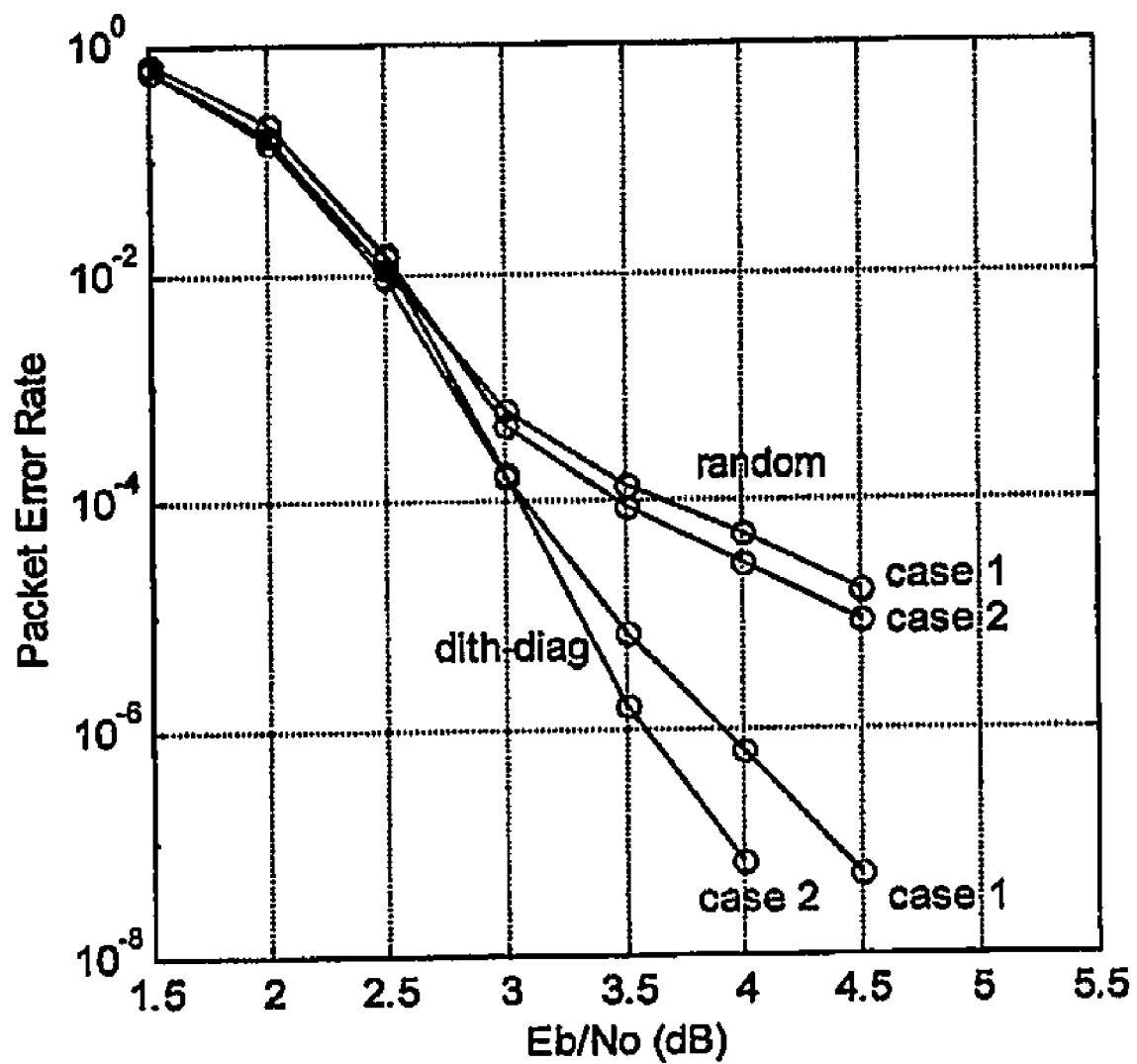

FIG. 12 shows the PER performance results obtained for two cases of rate ⅔ puncturing with an interleaver block size of K=512. The puncture masks for the (data, first parity, and second parity) sets were (1,0100,010) for case 1 and (01111111111111, 1001000, 0100100) for case 1, where "0" indicates a punctured bit. Note that the lengths of these masks and the repetition period of the feedback polynomial (15) are relative primes. The code rate was exactly ⅔ in both cases. Results are shown for both the random and dithered-diagonal interleavers. FIG. 12 shows that the improvement in flare performance with the random interleaver is small. However, the improvement in flare performance for the dithered-diagonal interleaver is significant. The improvement at a PER of $10^{-7}$ is about 0.5 dB. The degradation at a PER of $10^{-1}$ is less than 0.1 dB.

This technique of puncturing a small number of data bits to improve flare performance also works well for 8-state and 4-state codes. Thus, the utility of lower complexity 8-state codes (and even 4-state codes), which tend to have poorer flare performance than 16-state codes, is expected to greatly increase with this puncturing technique.

The above-described embodiments of the invention are intended to be examples of the present invention. Alterations, modifications and variations may be effected to the particular embodiments by those of skill in the art, without departing from the scope of the invention which is defined solely by the claims appended hereto.

What is claimed is:

1. A method of determining interleaving indices for an interleaver, acting on K elements, comprising:
   determining a minimum acceptable spread, spread being measured as the minimum of the sum of the distance between two elements prior to being interleaved, and the distance between the same two elements after being interleaved, over all pairs of elements;
   for each element, selecting an index from a predefined set of indices, the selected index maintaining the minimum acceptable spread; and
   sorting the selected index elements to provide a quantized integer index vector.

2. A method as in claim 1, wherein the predefined set of indices is a subset of the set of real numbers.

3. A method as in claim 1, wherein the predefined set of indices is (0,K).

4. A method as in claim 1, wherein the step of selecting an index includes randomly selecting an index from the predefined set of indices.

5. A method as in claim 4, wherein the step of selecting an index includes discarding the randomly selected index if the minimum acceptable spreading goal is not maintained.

6. A method as in claim 1, wherein the predefined set of indices is determined by:
   defining a set of at least K points;
   offsetting the points by varying the location of each point by a distance; and
   defining the predefined set of indices as a subset of points in the set of at least K offset points.

7. A method as in claim 6, wherein the predefined set includes K points.

8. A method as in claim 6, wherein prior to offsetting the defined set is arranged in rows and columns.

9. A method as in claim 6, wherein prior to of offsetting, each point in the defined set is separated from the closest neighbouring points by √K units.

10. A method as in claim 6, further including the step of rotating the defined set of points prior to defining the predefined set of indices.

11. A method as in claim 10, wherein the set of points is rotated 45°.

12. A method, in a communications system of determining interleaving indices for interleaving K elements comprising:
    defining a set of at least K points;
    offsetting the at least K points by varying the location of each point by a distance;
    defining a subset of K points from the points in the set; and
    determining a set of interleaving indices from the subset of K points.

13. A method as in claim 12, wherein prior to offsetting the defined set is arranged in rows and columns.

14. A method as in claim 12, wherein, prior to offsetting, each point in the defined set is separated from the closest neighbouring points by √K units.

15. A method as in claim 13, wherein the rows and columns of the defined set are parallel to the x and y axes respectively.

16. A method as in claim 12, further including the step of rotating the defined set of points prior to defining the predefined set.

17. A method as in claim 16, wherein the set to be rotated is rotated 45°.

18. A method as in claim 12, wherein the distance that points are offset is taken from a randomly distributed set of distances.

19. A method as in claim 12, wherein the points are offset in a direction parallel to one of the rows or columns of the set.

20. A method as in claim 19, wherein all points in a row are offset by a same distance.

21. A method as in claim 20, wherein the offsetting of points in a row is independent of the offsetting of points in another row.

22. A method as in claim 19, wherein the all points in a columns are offset by the same distance.

23. A method as in claim 22, wherein the offsetting of points in a column is independent of the offsetting of points in another column.

24. A method as in claim 12, wherein range of the offset distance is an integer multiple of √K.

25. A method as in claim 12, wherein the defined subset is enclosed in a square.

26. A method as in claim 25, wherein the sides of the square are of length K units.

27. A method as in claim 25, wherein the sides of the square are parallel to the x and y axes.

28. A method as in claim 12, wherein the step of determining includes sorting selected index elements to provide a quantized integer index vector.

29. A method as in claim 12, wherein the indices include real read indices.

30. A method as in claim 12, wherein the indices include real write indices.

31. A method as in claim 12, wherein K is twice the value of a perfect square.

32. A method as in claim 31, wherein an equal offsetting distance is applied to all points in a given row, and to all rows $$\sqrt{\frac{K}{2}}$$

away from the given row.

33. A method as in claim 31, wherein $$\sqrt{\frac{K}{2}},$$

is relatively prime to the repetition period of a feedback polynomial associated with the interleaving process.

34. A method as in claim 12, further comprising the step of ordering the K symbols according to the set of interleaving indices.

35. A method of post-processing a set of interleaver indices associated with a recursive systematic convolutional encoder, which in turn is associated with a turbo-code encoder, said recursive systematic convolutional encoder having associated feedback and feedforward polynomials, comprising:
    determining a minimum distance goal for the associated turbo-code encoder;
    determining a low weight input pattern for the recursive systematic convolutional encoder to generate a first low weight recursive systematic convolutional codeword;
    interleaving the determined input pattern; and
    re-ordering the interleaver indices, to eliminate the generated low weight turbo-code codeword, if the interleaved pattern generates a second recursive systematic convolutional codeword such that the weight of the turbo-code codeword weight is less than the minimum distance goal.

36. An interleaver for a communications system comprising:

an input memory for receiving K elements from an input;

an output memory for providing K elements to an output;

an indexing engine for interleaving the K elements received from the input memory, in accordance with a quantized integer index vector, and providing the interleaved elements to the output memory, the interleaving indices being determined by determining a minimum acceptable spread, spread being measured as the minimum of the sum of the distance between two elements prior to being interleaved, and the distance between the same two elements after being interleaved, over all pair of elements, for each element, selecting an index from a predefined set of indices, the selected index maintaining the minimum acceptable spread and sorting the selected index elements to provide the quantized integer index vector.

37. An interleaver as in claim 36, wherein the indices are determined by randomly selecting an index from a set of possible indices, the selected index maintaining the minimum acceptable spreading goal in combination with the previously selected indices.

38. An interleaver as in claim 37, wherein the indices are determined by randomly selecting an index from the set of (0,K).

39. An interleaver, as in claim 37, wherein the predefined set of indices is determined by:

defining a set of at least K points;

offsetting the points by varying the location of each point by a distance; and defining a set of possible indices as a subset of points in the set of at least K offset points.

40. An interleaver for a communications system comprising:

an input memory for receiving K elements from an input;

an output memory for providing K elements to an output;

an indexing engine for interleaving the K elements received from the input memory, in accordance with a quantized integer index vector, and providing the interleaved elements to the output memory, the interleaving indices being determined by defining a set of at least K points offsetting the points by varying the location of each point by a distance, defining a set of possible indices as a subset of points in the set of at least K offset points and determining the quantized integer index vector from K selected points from the set of possible indices.

41. An interleaver, as in claim 40, wherein the quantized integer index vector contains $$\sqrt{\frac{K}{2}}$$

index increments.

42. A method of encoding a set of elements in a communications system comprising:

receiving a set of elements;

encoding a copy of the received set with a recursive systematic convolutional code;

interleaving a copy of the received set according to a set of interleaving indices providing a minimum spread, spread being measured as the minimum of the sum of the distance between two elements prior to being interleaved, and the distance between the same two elements after being interleave over all pairs of elements;

encoding the interleaved copy with a recursive systematic convolutional code;

puncturing the received set, the encoded copy, and the encoded interleaved copy; and transmitting the punctured set, the punctured encoded copy, and the punctured encoded interleaved copy to a modulator.

* * * * *

UNITED STATES PATENT AND TRADEMARK OFFICE
CERTIFICATE OF CORRECTION

PATENT NO.       : 6,728,927 B2
APPLICATION NO.  : 09/864396
DATED            : April 27, 2004
INVENTOR(S)      : Stewart N. Crozier It is certified that error appears in the above-identified patent and that said Letters Patent is hereby corrected as shown below:

In the Abstract, item (57) title page right column, 6 line of the Abstract, delete the word "interleaves" and insert therefor --interleaver--;

In the drawings, sheet 6 of 12, Figure 6, in the box labeled "120", delete the text "Define a set at least" and insert therefor --Define a set of at least--;

Sheet 9 of 12, Figure 9, delete the figure and insert therefore the appended replacement Figure 9;

Sheet 10 of 12, Figure 10, delete the figure and insert therefore the appended replacement Figure 10;

Sheet 11 of 12, Figure 11, delete the figure and insert therefore the appended replacement Figure 11;

Column 1, lines 24, delete the phrase "Coding ad Decoding" and insert therefor --Coding and Decoding--;

Column 1, line 40, delete the phrase "in parallel with be data bits" and insert therefor --in parallel with the data bits--;

Column 1, line 60, delete the phrase "or are and" and insert therefor --or flare and--;

Column 2, line 14, delete the phrase "design of the interleaves need not be varied." and insert therefor --design of the interleaver need not be varied.--;

Column 2, line 39, delete the phrase "in general that interleaves with high-spread" and insert therefor --in general that interleavers with high-spread--;

Column 2, line 66, delete the phrase "the interleaved is completely defined" and insert therefor --the interleaver is completely defined--

(further corrections on appended sheets)

Column 3, line 21, delete equation (1) reading " $S_{old}'''(J,i,j) = |I(i) - I(j)|, \text{ for } |i-j| < j$ " and insert therefore -- $S_{old}'''(J,i,j) = |I(i) - I(j)|, \text{ for } |i-j| < J$ --;

UNITED STATES PATENT AND TRADEMARK OFFICE
CERTIFICATE OF CORRECTION

PATENT NO. : 6,728,927 B2
APPLICATION NO. : 09/864396
DATED : April 27, 2004
INVENTOR(S) : Stewart N. Crozier It is certified that error appears in the above-identified patent and that said Letters Patent is hereby corrected as shown below:

Column 3, line 26, delete equation (2) reading " $S'_{old}(J,i) = \min_{IJ=1}\lfloor S''_{old}(J,i,j) \rfloor$ " and insert therefor -- $S'_{old}(J,i) = \min_{j, j \neq 1}[S''_{old}(J,i,j)]$ --;

Column 3, line 33, delete equation (3) reading " $S_{old}(J) = \min_{i}[S'_{old}(J,i)]$ " and insert therefor -- $S_{old}(J) = \min_{i}[S'_{old}(J,i)]$ --;

Column 4, line 2, insert the phrase --on K-- after the word "acting";

Column 4, line 13, delete the phrase "(0,K)" and insert therefor -- [O,K] --;

Column 4, line 18, delete the phrase "provide a a method of" and insert therefor --provide a method of--;

Column 4, line 23, delete the phrase "defining the predefines set of indices" and insert therefor -- defining the predefined set of indices --;

Column 4, line 36, delete the phrase "distance is applied to all points in a given rows" and insert therefor --distance is applied to all points in a given row and to all rows--;

Column 4, line 50, delete the phrase "the set of determining" and insert therefor --the step of determining--;

Column 4, line 53, delete the phrase "According to yet a another" and insert therefor --According to yet another--;

Column 4, line 67, delete the phrase "the selected index maintain the minimum" and insert therefor --the selected index maintaining the minimum--;

Column 5, line 28, delete the phrase "the sum of be distance" and insert therefor --the sum of the distance--;

Column 5, line 49, delete the phrase "two rate ½ PSC encoders" and insert therefor --two rate ½ RSC encoders--;

Column 5, line 50, delete the phrase "illustrates a prior at implementation" and insert therefor --illustrates a prior art implementation--;

UNITED STATES PATENT AND TRADEMARK OFFICE
CERTIFICATE OF CORRECTION

PATENT NO. : 6,728,927 B2
APPLICATION NO. : 09/864396
DATED : April 27, 2004
INVENTOR(S) : Stewart N. Crozier It is certified that error appears in the above-identified patent and that said Letters Patent is hereby corrected as shown below:

Column 6, line 36, delete equation (4) reading " $S''_{now}(i,j) = |I(i) - I(j)| + i - j|$ " and insert therefor -- $S''_{new}(i,j) = |I(i) - I(j)| + |i - j|$ --;

Column 6, line 40, delete equation (5) reading " $S'_{new}(i) = \min_{jj \times 1}[S''_{new}(i,j)]$ " and insert therefor -- $S'_{new}(i) = \min_{j, j \neq i}[S''_{new}(i,j)]$ --;

Column 6, line 45, delete (6) reading " $S_{new} = \min_{i}[S'_{new}(i)]$ " and insert therefor -- $S_{new} = \min_{i}[S'_{new}(i)]$ --;

Column 7, line 5, delete equation (7) reading $S^-_{real}(i,j) = |R(i) - R(j)| + |i - j|$ " " and insert therefor -- $S''_{real}(i,j) = |R(i) - R(j)| + |i - j|$ --;

Column 7, line 10, delete equation (8) reading " $S'_{real}(i) = \min_{ij=1}[S''_{real}(i,j)]$ " and insert therefor -- $S'_{real}(i) = \min_{j, j \neq i}[S''_{real}(i,j)]$ --;

Column 7, line 16, delete equation (9) reading " $S_{real} = \min_{i}[(S'_{real}(i)]$ " and insert therefor -- $S_{real} = \min_{i}[S'_{real}(i)]$ --;

Column 7, line 23, delete the phrase "from the real internal (0, K)." and insert therefor --from the real internal [0,K).--;

Column 7, line 41, delete the phrase " $J(Z(i)) = i$ " and insert therefor -- $I(Z(i)) = i$ --;

Column 7, line 67, delete the phrase "for K512 data bits" and insert therefor --for K=512 data bits--;

Column 8, line 13, delete the phrase "(0, K), although any range will do." and insert therefor --[0,K), although any range will do.--;

Column 8, line 23, delete the phrase "teal spread" and insert therefor --real spread--;

UNITED STATES PATENT AND TRADEMARK OFFICE
CERTIFICATE OF CORRECTION

PATENT NO. : 6,728,927 B2
APPLICATION NO. : 09/864396
DATED : April 27, 2004
INVENTOR(S) : Stewart N. Crozier It is certified that error appears in the above-identified patent and that said Letters Patent is hereby corrected as shown below:

Column 9, line 7 delete the phrase " $I(Z(i)) = Y'(i)$ " and insert therefor -- $I(Z(i)) = Y'(i)$ --;

Column 9, line 22 delete the sentences "The modulo nature of the interleaver also ensures that the spreading properties bold for tail-biting turbo codes. It has also been found that the interleaves can provide exceptional distance properties when n and the repetition period of the feedback polynomial are relative primes." and insert therefor --The modulo nature of the interleaver also ensures that the spreading properties hold for tail-biting turbo codes. It has also been found that the interleaver can provide exceptional distance properties when n and the repetition period of the feedback polynomial are relative primes.--;

Column 9, line 36, delete the word "lowers" and insert therefor --lower--;

Column 9, line 54, delete the word "interleaves" and insert therefor --interleaver--;

Column 10, line 59, delete the phrase " $d_{goal}(2)6+8m$ " and insert therefor -- $d_{goal}(2) = 6+8m$ --;

Column 11, line 3, delete the phrase " $d_{goal}(3)$ " and insert therefor -- $d_{goal}(3)$ --;

Column 11, line 12, delete the phrase "input-weight4" and insert therefor --input-weight-4--;

Column 11, line 15, delete the phrase "input-weight4" and insert therefor --input-weight-4--;

Column 11, line 20, delete the phrase " $t_{goal}(4)$ " and insert therefor -- $d_{goal}(4)$ --;

Column 11, line 57, delete the phrase "input-weight4" and insert therefor --input-weight-4--;

Columne 11, line 60, delete the phrase "input-weight4" and insert therefor --input-weight-4--;

Column 12, line 59, delete the word "bath" and insert therefor --both--;

Column 13, line 58, delete the phrase "(two 1's 15 apart" and insert therefor --(two 1's 15 apart--;

UNITED STATES PATENT AND TRADEMARK OFFICE
CERTIFICATE OF CORRECTION

PATENT NO. : 6,728,927 B2
APPLICATION NO. : 09/864396
DATED : April 27, 2004
INVENTOR(S) : Stewart N. Crozier It is certified that error appears in the above-identified patent and that said Letters Patent is hereby corrected as shown below:

Column 14, line 20, delete the word "interleaves" and insert therefor --interleaver--;

Column 14, line 20, delete the phrase "most of be" and insert therefor --most of the--;

Column 14, line 29, delete the phrase "less than 1. to start the iterative" and insert therefor --less than 1, to start the iterative--;

Column 14, line 32, delete the phrase "code rate or the second RSC code" and insert therefor --code rate for the second RSC code--;

Column 14, line 34 delete the word "sparset" and insert therefor --sparsest--;

Column 14, line 46, delete the phrase "(1,0100,010)" and insert therefor --(1,0100,0010)--;

Column 14, line 47, delete the phrase "case 1" and insert therefor --case 2--;

Column 15, lines 18-19, delete the phrase "A method as in claim 1, wherein the predefined set of indices is (0,K)." and insert therefor -- A method as in claim 1, wherein the predefined set of indices is [0,K).--;

Column 15, claim 9, line 37, delete "of"

Column 17, lines 1-3, delete the phrase "a second recursive systematic convolutional codeword such that the weight of the turbo-code codeword weight is less than the minimum distance goal." and insert therefor -- a second recursive systematic convolutional codeword such that the weight of the turbo-code codeword is less than the minimum distance goal.--;

Column 17, lines 28-30, delete the phrase "An interleaver as in claim 37, wherein the indices are determined by randomly selecting an index from the set of (0,k)." and insert therefor --An interleaver as in claim 37, wherein the indices are determined by randomly selecting an inde from the set of [0,K).--;

UNITED STATES PATENT AND TRADEMARK OFFICE
CERTIFICATE OF CORRECTION

PATENT NO. : 6,728,927 B2
APPLICATION NO. : 09/864396
DATED : April 27, 2004
INVENTOR(S) : Stewart N. Crozier It is certified that error appears in the above-identified patent and that said Letters Patent is hereby corrected as shown below:

Column 18, lines 26-32, delete the phrase "interleaving a copy of the received set according to a set of interleaving indices providing a minimum spread, spread being measured as the minimum of the sum of the distance between two elements prior to being interleaved, and the distance between the same two elements after being interleave over all pairs of elements;" and insert therefor --interleaving a copy of the received set according to a set of interleaving indices providing a minimum spread, spread being measured as the minimum of the sum of the distance between two elements prior to being interleaved, and the distance between the same two elements after being interleaved over all pairs of elements;--.

Signed and Sealed this

Second Day of January, 2007

JON W. DUDAS
*Director of the United States Patent and Trademark Office*